United States Patent
Mitani et al.

(10) Patent No.: US 10,803,775 B2
(45) Date of Patent: Oct. 13, 2020

(54) DISPLAY DEVICE AND METHOD FOR DRIVING DISPLAY DEVICE

(71) Applicants: SHARP KABUSHIKI KAISHA, Sakai-shi, Osaka (JP); SAKAI DISPLAY PRODUCTS CORPORATION, Sakai-shi, Osaka (JP)

(72) Inventors: Masahiro Mitani, Sakai (JP); Kohzoh Nakamura, Sakai (JP); Kiyoshi Minoura, Sakai (JP); Hiroshi Tsuchiya, Sakai (JP); Yozo Narutaki, Sakai (JP)

(73) Assignees: SHARP KABUSHIKI KAISHA, Sakai, Osaka (JP); SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/641,596

(22) PCT Filed: Sep. 20, 2017

(86) PCT No.: PCT/JP2017/033926
§ 371 (c)(1),
(2) Date: Feb. 24, 2020

(87) PCT Pub. No.: WO2019/058463
PCT Pub. Date: Mar. 28, 2019

(65) Prior Publication Data
US 2020/0202752 A1   Jun. 25, 2020

(51) Int. Cl.
*G09F 9/30* (2006.01)
*G02F 1/1343* (2006.01)
(Continued)

(52) U.S. Cl.
CPC .......... *G09F 9/30* (2013.01); *G02F 1/134336* (2013.01); *G09G 3/3233* (2013.01);
(Continued)

(58) Field of Classification Search
CPC ............ G09G 3/3233; G09G 2300/046; G02F 1/133553; G09F 9/30; H01L 27/3232
See application file for complete search history.

(56) References Cited

U.S. PATENT DOCUMENTS

2003/0193457 A1 * 10/2003 Wang ....................... G09G 3/20
345/84
2003/0201960 A1   10/2003 Fujieda
(Continued)

FOREIGN PATENT DOCUMENTS

JP     H07-271323 A    10/1995
JP     2000-347622 A   12/2000
(Continued)

OTHER PUBLICATIONS

International Search Report for International application No. PCT/JP2017/033926.

*Primary Examiner* — Alexander P Gross
(74) *Attorney, Agent, or Firm* — ScienBiziP, P.C.

(57) ABSTRACT

A display apparatus according to one embodiment comprises pixels each comprising a liquid crystal display element (LC element) and an organic EL display element (EL element). The EL element comprises an anode and a cathode electrically separated from each electrode of the LC element. Each pixel comprises a first transistor which changes the magnitude of a current flowing through the EL element based on the potential of a first bus line; a second transistor which electrically separates the first bus line and the LC element; and a third transistor which electrically connects the first and second transistor with the first bus line. A method for driving a display device according to one embodiment reduces the
(Continued)

potential difference between the pixel electrode and the counter electrode before turning off the second transistor during switching from display by the LC element to display by the EL element.

9 Claims, 20 Drawing Sheets

(51) Int. Cl.
    *G09G 3/36*     (2006.01)
    *G09G 3/3233*     (2016.01)
    *G09G 3/3225*     (2016.01)
    *H01L 27/32*     (2006.01)
    *G02F 1/1335*     (2006.01)

(52) U.S. Cl.
    CPC ...... *G09G 3/3611* (2013.01); *G02F 1/133553* (2013.01); *G09G 3/3225* (2013.01); *G09G 2300/046* (2013.01); *H01L 27/3232* (2013.01)

(56) References Cited

U.S. PATENT DOCUMENTS

| | | |
|---|---|---|
| 2008/0180618 A1 | 7/2008 | Fujieda |
| 2009/0268118 A1* | 10/2009 | Chang ................. G09G 3/3648 349/48 |
| 2012/0127220 A1 | 5/2012 | Noguchi |
| 2013/0141316 A1* | 6/2013 | Lee ..................... G09G 3/3266 345/76 |
| 2016/0267827 A1 | 9/2016 | Byun et al. |

FOREIGN PATENT DOCUMENTS

| | | |
|---|---|---|
| JP | 2003-157030 A | 5/2003 |
| JP | 2003-316295 A | 11/2003 |
| JP | 2003-322850 A | 11/2003 |
| JP | 3898012 B2 | 3/2007 |
| JP | 2013-117725 A | 6/2013 |
| WO | 2011/013409 A1 | 2/2011 |

* cited by examiner

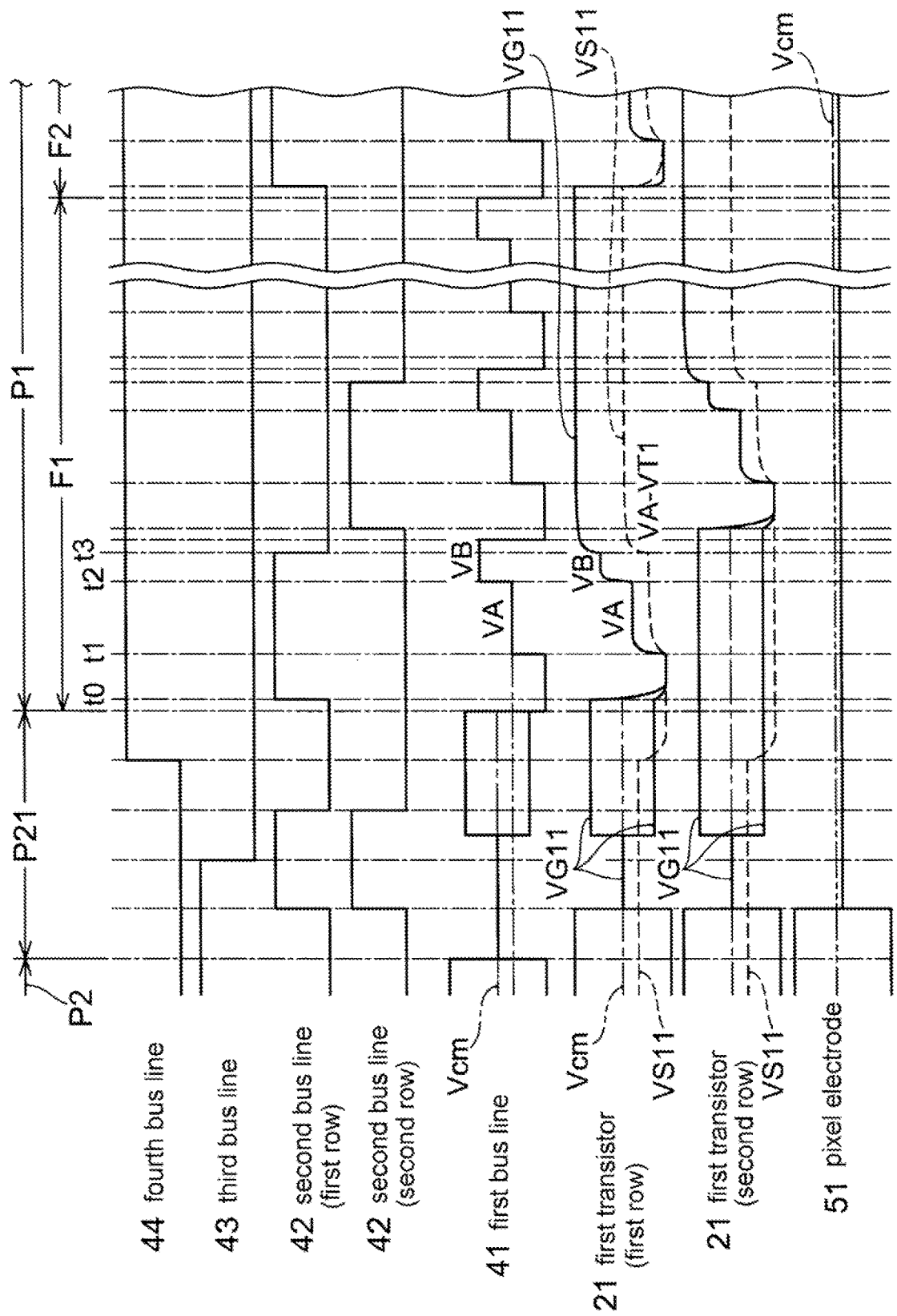

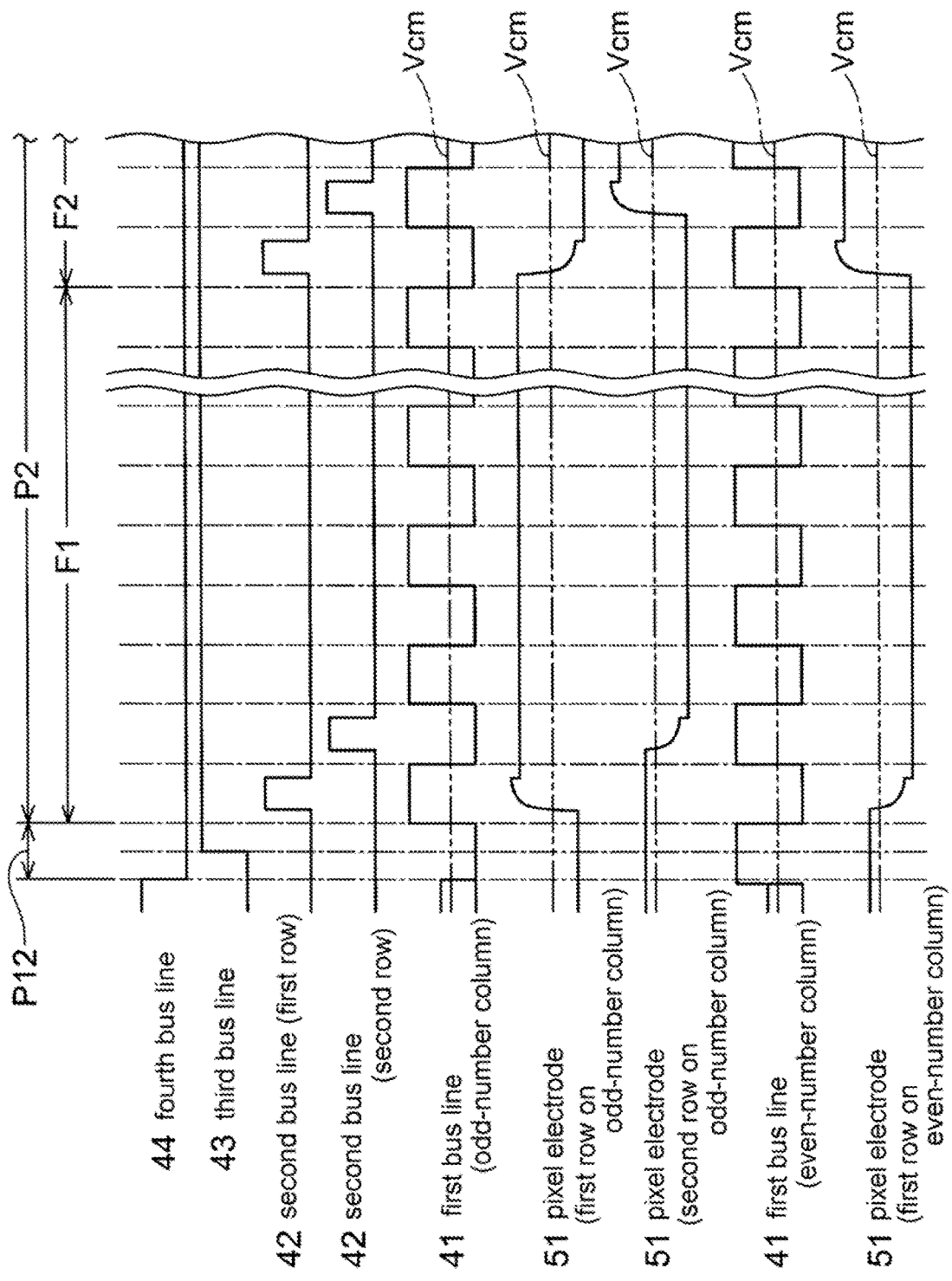

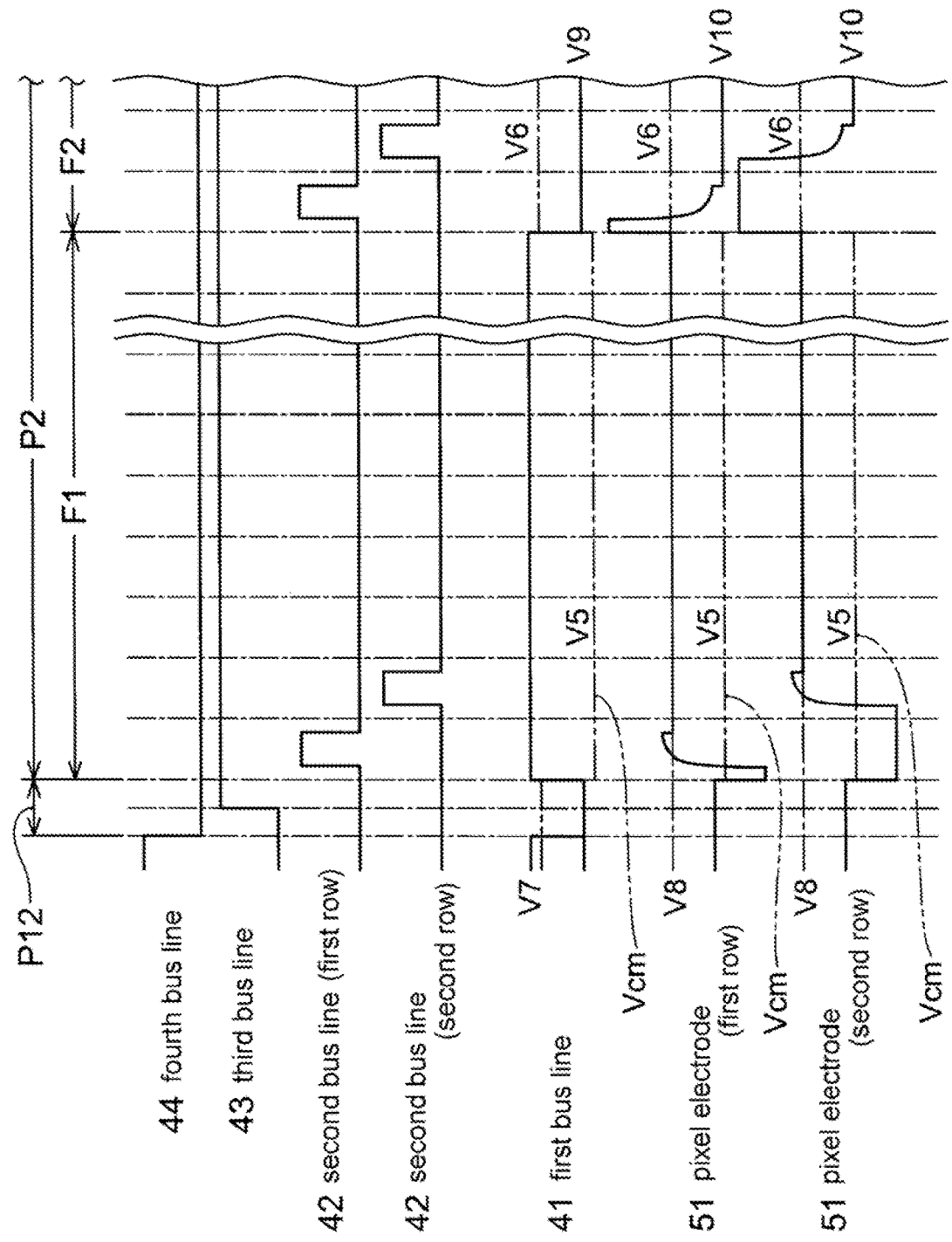

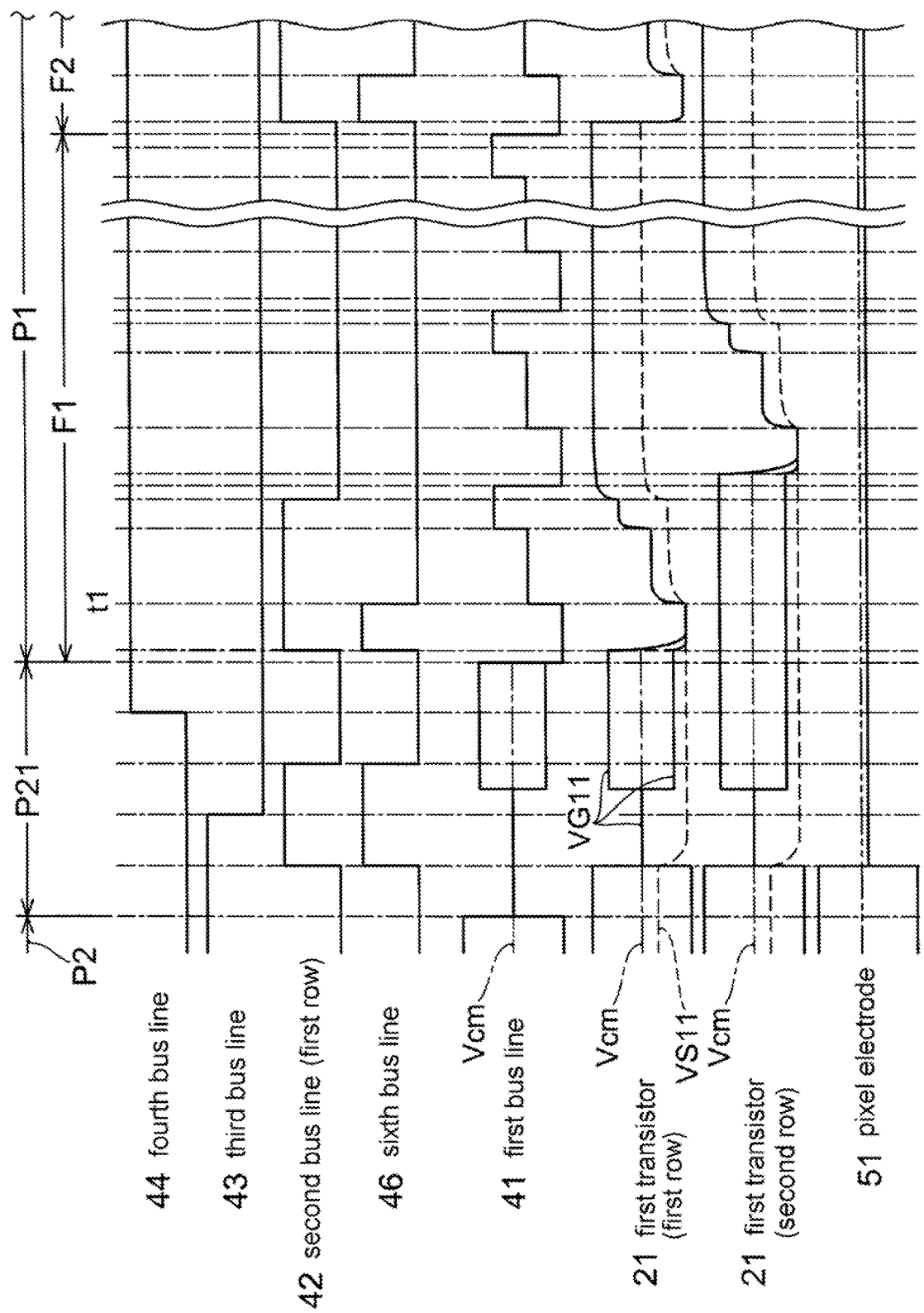

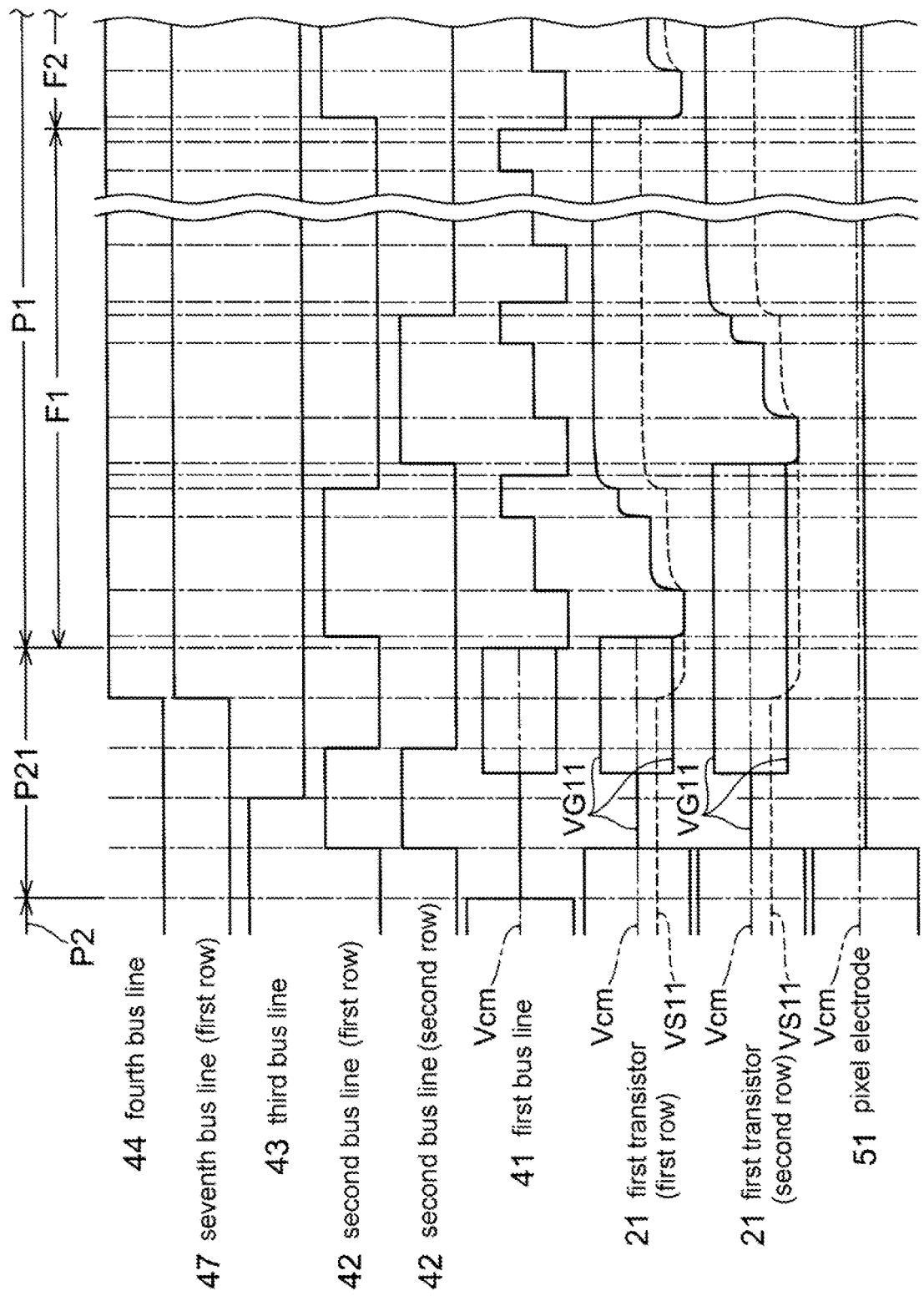

DISPLAY DEVICE AND METHOD FOR DRIVING DISPLAY DEVICE

TECHNICAL FIELD

The present invention relates to a display apparatus including a liquid crystal display element and an organic EL display element at each one of a plurality of pixels and a method for driving such a display apparatus.

BACKGROUND ART

In recent years, thin display apparatus such as liquid crystal display panel and organic EL display panel is widely used as main component of portable device such as smartphone, tablet type PC, or wearable terminal. The display apparatus to be used in such a portable device is specifically required to have display performances stable against ambient brightness which may be variable depending on the place of use, as well as lower power consumption performances. Therefore, display apparatuses including a reflective liquid crystal display element capable of exhibiting excellent visibility with lower electric power in a bright environment, such as outdoors, and an organic EL light-emitting element capable of exhibiting excellent visibility even in a dark environment have been studied (for example, refer to Patent Document 1).

The display apparatus discussed in Patent Document 1 includes a normally white reflection type liquid crystal display element which is provided for each pixel and having a reflection electrode, and an organic EL light-emitting element having an anode formed for each pixel. The anode of the organic EL light-emitting element is connected to a drain of a TFT for EL, and a gate of the TFT for EL is connected to a drain of a TFT for liquid crystal along with a pixel electrode of the reflection type liquid crystal display element. When display by the reflection type liquid crystal display element is performed, a desired driving voltage is applied to the reflection type liquid crystal display element from a source bus line via the TFT for liquid crystal within a range not exceeding a threshold voltage of the TFT for EL. In addition, when display by the organic EL light-emitting element is performed, a voltage holding the reflection type liquid crystal display element in a black display state and being equal to or higher than the threshold voltage of the TFT for EL is applied to the gate of the TFT for EL from the source bus line via the TFT for liquid crystal. The TFT for EL is turned into on state corresponding to the applied voltage, and desired driving current is supplied to the organic EL display element.

PRIOR ART DOCUMENT

Patent Document

Patent Document 1: Japanese Patent No. 3,898,012

SUMMARY OF THE INVENTION

Problem to be Solved by the Invention

In the display apparatus disclosed in Patent Document 1, by applying a voltage equal to or greater than a predetermined magnitude to the source bus line the organic EL light-emitting element is brought into a light-emitting state while the liquid crystal display element is brought into the black display state. Therefore, it is necessary to supply the driving voltage to the liquid crystal display element even during the display by the organic EL light-emitting element. Therefore, it may be difficult to obtain sufficient effect for reducing the electric power consumption by the entire apparatus including consumption by a driver supplying a data voltage to each display element. In addition, in the display by each of the liquid crystal display element and the organic EL light-emitting element, the voltage to be applied to each element may be limited within a range having no influence on another display element. Therefore, it may be difficult to employ a suitable driving method and data voltage that can be used for an individual liquid crystal display apparatus or organic EL display apparatus. For example, in the display by the liquid crystal display element, controlling the inversion driving may become complicated. In addition, in the display by each of the liquid crystal display element and the organic EL light-emitting element, it may be difficult to use a wide-range data voltage that is advantageous in realizing representation with multi-level grayscale.

In view of the foregoing, the present invention intends to provide a display apparatus including liquid crystal display elements and organic EL display elements, which can reduce constraints on the driving voltage of each liquid crystal display element (which may be hereinafter referred to as LC element) and each organic EL display element (which may be hereinafter referred to as EL element) and can further reduce the electric power consumption. In addition, the present invention intends to provide a method for driving a display apparatus that includes liquid crystal display elements and organic EL display elements and is capable of displaying images excellent in quality.

Means to Solve the Problem

A display apparatus according to Embodiment 1 of the present invention is characterized by comprising: a substrate comprising a plurality of bus lines; and a plurality of pixels provided on the substrate in a matrix pattern, each one of the plurality of pixels including a liquid crystal display element and an organic EL display element, wherein the plurality of bus lines comprises at least, a first bus line provided for each column in the plurality of pixels, a second bus line provided for each row in the plurality of pixels, a third bus line to be set to a predetermined potential when the liquid crystal display element is driven, and a fourth bus line to supply current to the organic EL display element, the liquid crystal display element comprises a pixel electrode and a counter electrode facing each other with an intervening liquid crystal layer containing a liquid crystal composition, the organic EL display element comprises an anode and a cathode each formed so as to be electrically separated from the pixel electrode and the counter electrode, and an organic layer interposed between the anode and the cathode, and each one of the plurality of pixels further comprises a first transistor to change, based on a potential of the first bus line, magnitude of current supplied to the organic EL display element, a second transistor to electrically separate the pixel electrode of the liquid crystal display element and the first bus line based on a potential of the third bus line, and a third transistor to electrically connect the first transistor and the second transistor to the first bus line based on a potential of the second bus line.

A method for driving a display apparatus according to Embodiment 1 of the present invention is characterized by that, in a driving method for a display apparatus comprising a liquid crystal display element and an organic EL display element at each one of a plurality of pixels wherein the liquid crystal display element and an organic EL display element are formed on a surface of a substrate, the method for driving the display apparatus comprises: when performing display by the organic EL display element, applying a voltage based on display data relating to display in each one of the plurality of pixels between a gate and a source of a first transistor that changes current flowing through the organic EL display element, and electrically separating the liquid crystal display element from a first bus line to be set to a potential based on the display data by using a second transistor connected to a pixel electrode of the liquid crystal display element, when performing display by the liquid crystal display element, electrically connecting the first bus line and the pixel electrode by turning on the second transistor and a third transistor provided between the second transistor and the first bus line, and in switching from the display by the liquid crystal display element to the display by the organic EL display element, reducing a potential difference between the pixel electrode and a counter electrode of the liquid crystal display element before bringing the second transistor from an ON state to an OFF state.

Effects of the Invention

According to the embodiments of the present invention, in a display apparatus including liquid crystal display element and organic EL display element, it is possible to reduce constraints on the driving voltage of liquid crystal display element and organic EL display element. In addition, it is possible to further reduce the electric power consumption. In addition, according to the embodiments of the present invention, it is possible to display images excellent in quality in a display apparatus including liquid crystal display elements and organic EL display elements.

BRIEF DESCRIPTION OF THE DRAWINGS

FIG. 6 is a timing chart illustrating an example of the operation during the period of display by the EL element in the method for driving the display apparatus according to the Embodiment 1 of the present invention.

FIG. 7B is a timing chart illustrating another example of the operation during the period of display by the LC element in the method for driving the display apparatus according to the Embodiment 1 of the present invention.

FIG. 7C is a timing chart illustrating another example of the operation during the period of display by the LC element in the method for driving the display apparatus according to the Embodiment 1 of the present invention.

FIG. 8B is a timing chart illustrating an example of the operation by the driving circuit illustrated in FIG. 8A.

FIG. 9B is a timing chart illustrating an example of the operation by the driving circuit illustrated in FIG. 9A.

EMBODIMENT FOR CARRYING OUT THE INVENTION

Hereinafter, a display apparatus and a method for driving a display apparatus according to the present invention will be described with reference to attached drawings. In embodiments described below, materials and shapes of respective constituent elements, relative positional relationships between them, and the magnitude of voltage and change timing thereof in each timing chart are merely illustrative. The display apparatus and the method for driving the display apparatus according to the present invention should not be restrictively interpreted by these disclosures.

Embodiment 1

Figure 1:
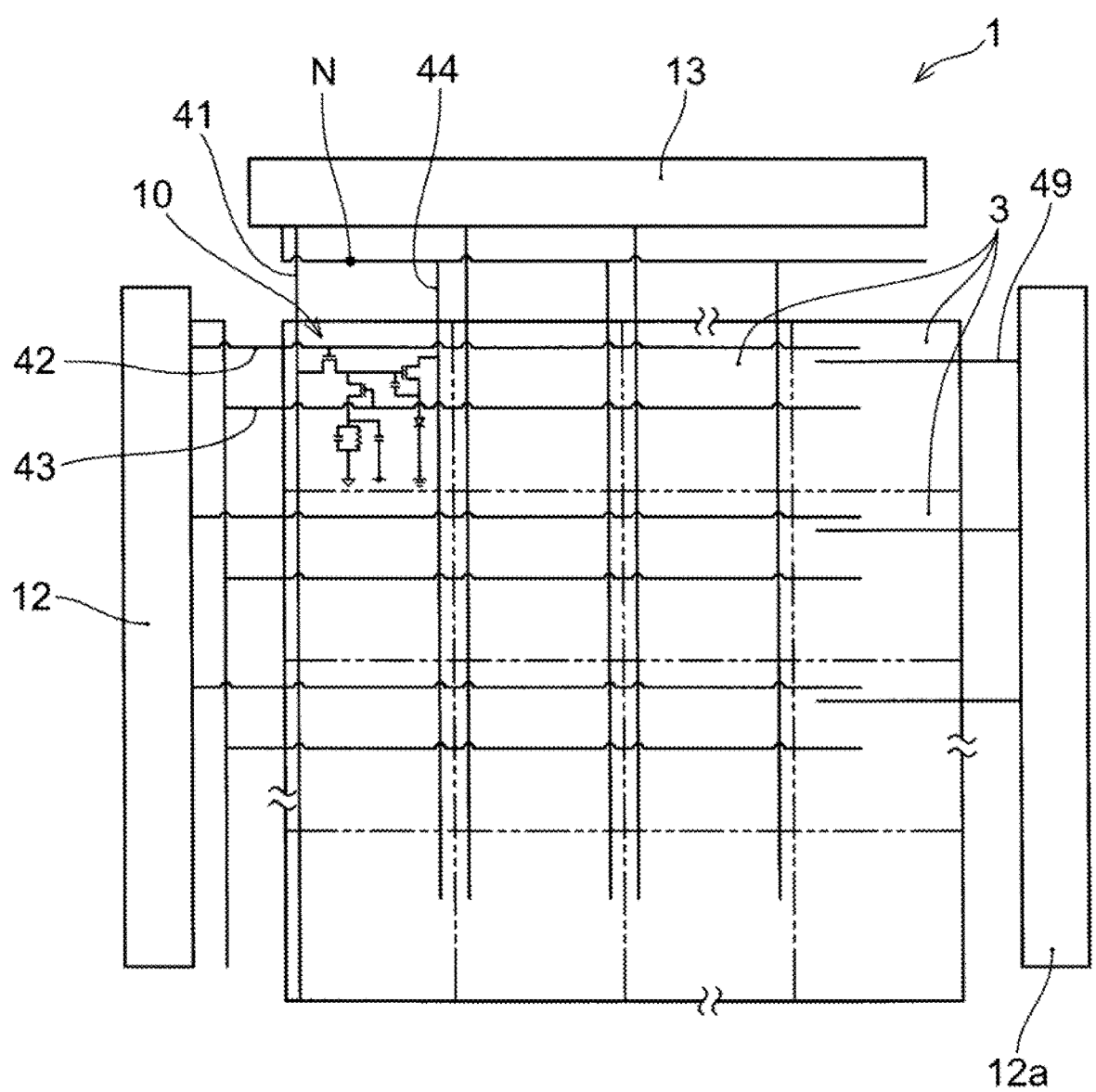
FIG. 1 is a view illustrating an example of the configuration of a driving circuit of a display apparatus according to Embodiment 1 of the present invention.
Figure 2:
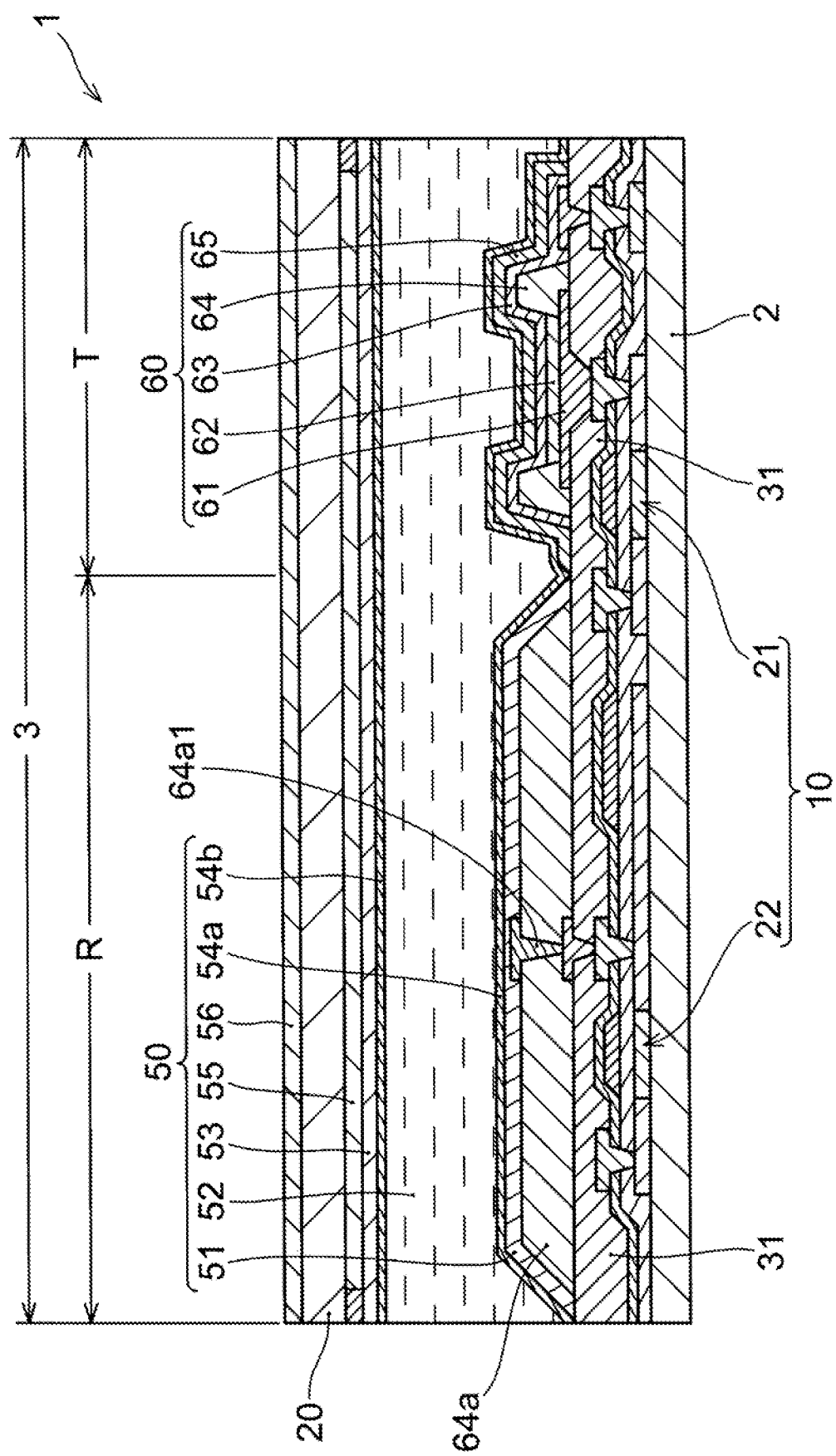
FIG. 2 is a view illustrating an example of a cross-sectional structure of the display apparatus according to the Embodiment 1 of the present invention.
Figure 3:
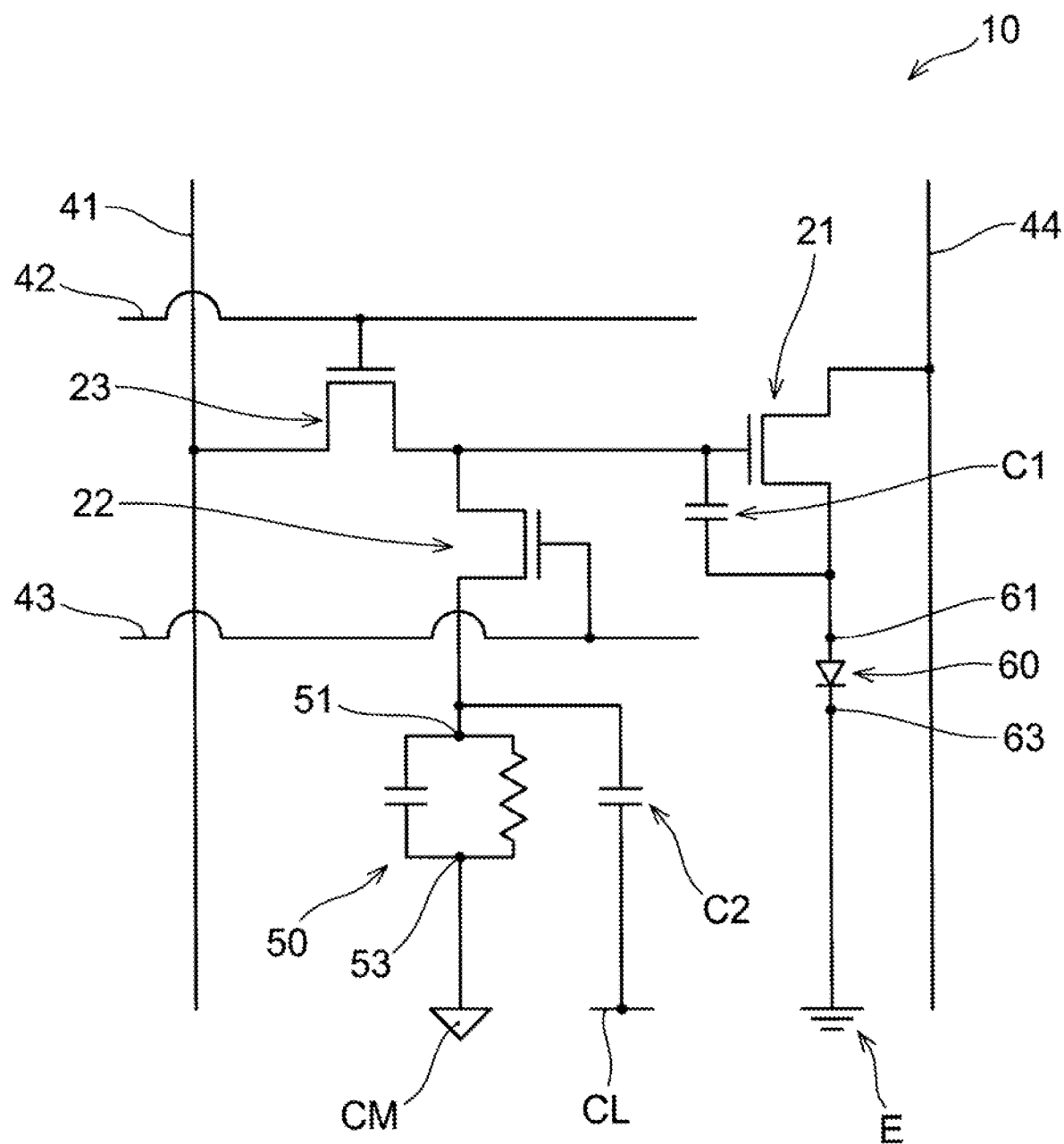
FIG. 3 is a view illustrating an example of a driving circuit for one pixel of the display apparatus according to the Embodiment 1 of the present invention.

FIG. 1 schematically illustrates an example of the configuration of an overall driving circuit of a display apparatus 1 according to Embodiment 1. FIG. 2 illustrates an exemplary cross section of one of a plurality of pixels 3 included in the display apparatus 1. FIG. 3 illustrates an example of a driving circuit 10 provided in each one of the plurality of pixels 3. As illustrated in FIGS. 1 to 3, the display apparatus 1 according to the present embodiment includes a substrate 2 including a plurality of bus lines (refer to FIG. 2) and the plurality of pixels 3 provided in a matrix pattern on the substrate 2. Each one of the plurality of pixels 3 includes a liquid crystal display element 50 and an organic EL display element 60. The plurality of bus lines includes first bus lines 41 provided for respective columns in the plurality of pixels 3 and second bus lines 42 provided for respective rows in the plurality of pixels 3, and further includes third bus lines 43 and fourth bus lines 44.

The display apparatus 1 includes a data line driver 13 and a scanning line driver 12. The data line driver 13 generates display data for each one of the plurality of pixels 3 based on brightness or luminance to be possessed by each one of the plurality of pixels 3 in a displayed image. The scanning line driver 12 generates a scanning signal for switching on/off of the driving circuit 10 of each one of the plurality of pixels 3. Each one of the plurality of first bus lines (source bus lines) 41 provided for each column of the pixel 3 is connected to the data line driver 13. Each one of the plurality of second bus lines (gate bus lines) 42 provided for each row of the pixel 3 is connected to the scanning line driver 12. In addition, in the example illustrated in FIG. 1, the fourth bus lines 44 are connected to the data line driver 13. The third bus lines 43 are connected to the scanning line driver 12. Alternatively, the third bus lines 43 may be connected to the data line driver 13 and the fourth bus lines 44 may be connected to the scanning line driver 12. In addition, the plurality of third bus lines 43 does not need to be branched from a single trunk bus line as illustrated in FIG. 1 and may be respectively connected to the scanning line driver 12. Similarly, each one of the plurality of fourth bus lines 44 may be connected to the data line driver 13.

Third bus line (switch bus line) 43 is set to a predetermined potential when the liquid crystal display element 50 is driven. For example, when the liquid crystal display element 50 is driven, the third bus line 43 is set to a potential determined in advance, which is either a high level potential higher than a desired threshold value (e.g., a potential at which a second transistor 22 described below is turned on) or a low level potential which is lower than the threshold value. When the liquid crystal display element 50 is not driven, the third bus line 43 is set to the other potential. In the example illustrated in FIG. 3, since the second transistor 22 connected to the third bus line 43 is an n-channel field effect transistor, the third bus line 43 is set to a potential higher than the threshold voltage when the liquid crystal display element 50 is driven. As a result, the second transistor 22 is turned on, and the liquid crystal display element 50 is connected to the first bus line 41 so as to be driven. Similarly, if the second transistor 22 connected to the third bus line 43 is a p-channel field effect transistor, the third bus line 43 is set to a potential lower than (negative potential having an absolute value larger than that of) the threshold voltage. As a result, the second transistor 22 is turned on, and the liquid crystal display element 50 is connected to the first bus line 41 so as to be driven. The fourth bus lines (current bus lines) 44 supply driving current to the organic EL display element 60. Although not illustrated in FIG. 1, the plurality of bus lines may further include another bus line, as a fifth bus line 45 (refer to FIG. 12) described below, in addition to the first to fourth bus lines 41 to 44. Further, the display apparatus 1 may include a second scanning line driver 12a, which is operable independent of the scanning line driver 12, as illustrated in FIG. 1. In the example illustrated in FIG. 1, a plurality of ninth bus lines 49 is connected to the second scanning line driver 12a. The ninth bus line 49 is provided for each row of the pixel matrix.

As illustrated in FIG. 2, the liquid crystal display element 50 includes a pixel electrode 51 and a counter electrode 53 facing each other with an intervening liquid crystal layer 52 containing a liquid crystal composition. The organic EL display element 60 includes an anode 61, a cathode 63, and an organic layer 62 interposed between the anode 61 and the cathode 63. The anode 61 and the cathode 63 are formed so as to be electrically separated from the pixel electrode 51 and the counter electrode 53 of the liquid crystal display element 50. More specifically, the display apparatus 1 is totally different from a display apparatus having structure in which, for example, either the liquid crystal display element or the organic EL display element is laminated on the other and any one of electrodes of the liquid crystal display element and the organic EL display element is commonly used between the liquid crystal display element and the organic EL display element. In the present embodiment, the voltage to be applied to only one of the liquid crystal display element 50 and the organic EL display element 60 is not directly applied to the display element to which the voltage should not be inherently applied. Accordingly, in the driving of any display element, it is considered in principle that there is no constraint on the driving voltage.

As illustrated in FIG. 3, each one of the plurality of pixels 3 (refer to FIG. 1) includes the driving circuit 10, and the driving circuit 10 includes a first transistor 1, the second transistor 22, and a third transistor 23. In the example illustrated in FIG. 3, the first to third transistors 21 to 23 are n-channel field effect transistors (n-FETs). A drain of the first transistor 21 is connected to the fourth bus line 44, and a source of the first transistor 21 is connected to the anode 61 of the EL element 60. An auxiliary capacitor C1 for the EL element is connected between the gate and the source of the first transistor 21. In addition, a gate of the second transistor 22 is connected to the third bus line 43, and a source of the second transistor 22 is connected to the pixel electrode 51 of the LC element 50. The counter electrode 53 of the LC element 50 is connected to a COM line CM that is common to respective pixels 3. An auxiliary capacitor C2 for the LC element is formed in such a manner that one end is connected to the pixel electrode 51 of the LC element 50, and the other terminal thereof is connected to a capacity line CL. A drain of the third transistor 23 is connected to the first bus line 41, and a gate thereof is connected to the second bus line 42. A source of the third transistor 23 is connected to the gate of the first transistor 21 and the drain of the second transistor 22. Accordingly, the third transistor 23 electrically connects the first transistor 21 and the second transistor 22 to the first bus line 41 based on the potential of the second bus line 42. The first transistor 21, then the third transistor 23 is in the ON state, changes the magnitude of the current supplied to the organic EL display element 60 based on the potential of the first bus line 41. Accordingly, in the present embodiment, by setting the second and third bus lines 42 and 43 to have appropriate potentials, the voltage based on the potential of the first bus line 41 can be applied to the LC element 50 and the current based on the potential of the first bus line 41 can flow through the EL element 60.

Further, in the present embodiment, the second transistor 22 electrically separates the first bus line 41 and the pixel electrode 51 of the liquid crystal display element 50 based on the potential of the third bus line 43. Accordingly, for example, by setting the third bus line 43 to have a potential at which the second transistor 22 is turned off during the display by the EL element 60, it is possible to stop applying the voltage to the LC element 50. Therefore, it becomes possible to use, as the LC element 50, a normally black mode liquid crystal display element that is in the black display when no voltage is applied. In that case, applying the voltage to the LC element 50 is only required during the period of display by the LC element 50. Accordingly, there is a possibility that the electric power to be consumed by the display apparatus 1 can be reduced.

In addition, since the LC element 50 can be electrically separated from the first bus line 41 and the EL element 60, constraints on the driving voltage imposed from the viewpoint of avoiding the influence on the LC element 50 can be eliminated or reduced. Accordingly, there are cases that the EL element 60 can be driven with a wide range of current. In addition, in an environment such as a room where the surrounding light is relatively dark, when the LC element 50 and the EL element 60 are used together to perform a display operation, there are cases that the color of the LC element 50 performing reflective display with a narrow color reproduction range is mixed with the color of the EL element 60 having a wider color reproduction range, thereby, performances of the EL element 60 having a wider color reproduction range cannot be sufficiently utilized. However, this kind of case can be avoided.

Figure 4:
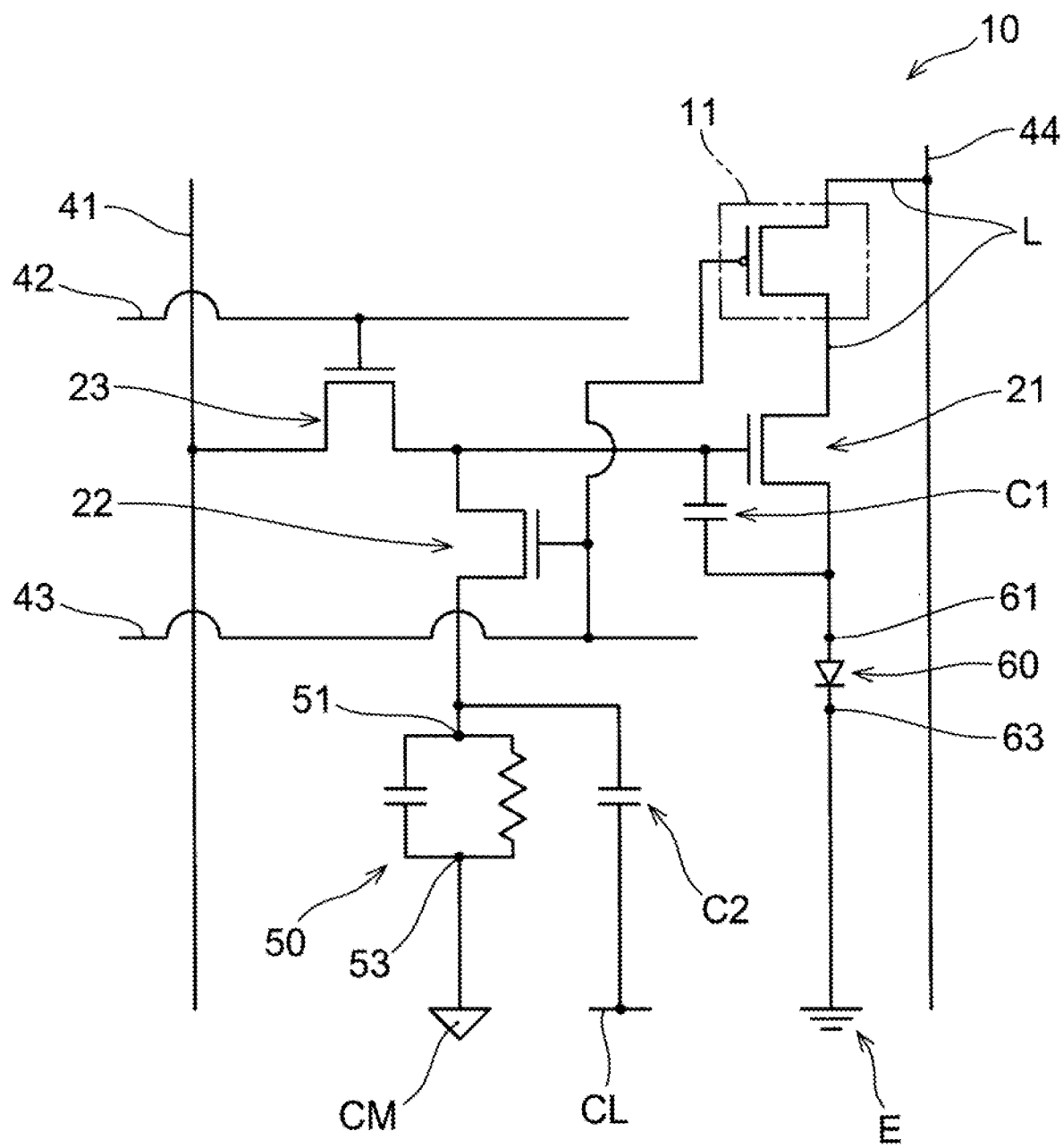
FIG. 4 is a view illustrating an example of a driving circuit including a current cut-off circuit, in the display apparatus according to the Embodiment 1 of the present invention.

Further, as illustrated in FIG. 4, the display apparatus 1 according to the present embodiment can further include a current cut-off circuit 11 configured to stop current supply from the fourth bus line 44 to the organic EL display element 60. By including the current cut-off circuit 11, for example, even in the case of setting the first bus line 41 to have a potential at which the first transistor 21 is turned on during the display by the LC element 50, it is possible to prevent current from flowing through the EL element 60 and eliminate unnecessary power consumption. In addition, without necessity of considering unintended light emission of the EL element 60 or the like, it is possible to apply a wide range of voltage to the LC element 50. For example, it is possible to easily perform frame inversion driving or the like for preventing so-called "burning" of the LC element 50.

In the example illustrated in FIG. 4, the current cut-off circuit 11 is disposed halfway on a supply line L of driving current from the fourth bus line 44 to the EL element 60, and the supply line L is divided by the current cut-off circuit 11. FIG. 4 illustrates an example of the current cut-off circuit 11 constituted by a p-channel field effect transistor (p-FET) having a source and a drain to which the divided driving current supply line L is connected. Further, a gate of the p-FET serving as the current cut-off circuit 11 and the gate of the second transistor 22 are connected to the third bus line 43. For example, in the example illustrated in FIG. 4, the third bus line 43 is set to have a potential not less than the threshold value of the second transistor 22 being an n-channel field effect transistor (n-FET) and not less than the threshold value of the p-FET being the current cut-off circuit 11. By doing so, it is possible to turn on the second transistor 22 and bring the current cut-off circuit 11 into a cut-off state. As mentioned above, the current cut-off circuit 11 is preferably configured in such a way as to stop the current supply to the organic EL display element 60 when the first bus line 41 and the pixel electrode 51 of the liquid crystal display element 50 are electrically connected by the second transistor 22. Since the example of the driving circuit 10 illustrated in FIG. 4 is the same as the example illustrated in FIG. 3 except for including the current cut-off circuit 11, the description of constituent elements other than the current cut-off circuit 11 is omitted.

The current cut-off circuit 11 is not specifically limited as long as it can stop the current supply to the EL element 60 and can be a transistor other than a p-FET or a semiconductor switch. In addition, the current cut-off circuit 11 is not necessarily controlled with the potential of the third bus line 43. For example, the current cut-off circuit 11 may be connected to the scanning line driver 12 (refer to FIG. 1) or the data line driver 13 (refer to FIG. 1) via a signal line different from the first to fourth bus lines 41 to 44. In addition, the current cut-off circuit 11 is not necessarily provided for each one of the plurality of pixels 3. For example, the current cut-off circuit 11 can be provided halfway (for example, at a point N in FIG. 1) on the trunk bus line of the fourth bus line 44 where the bus line is not yet branched to respective columns of the plurality of pixels 3. Alternatively, the current cut-off circuit 11 may be an arbitrary switch such as a semiconductor switch or a mechanical switch that can stop the operation of a power source (not illustrated) supplying current to the fourth bus line 44, or an arbitrary output stop (disenable) mechanism provided in such a power source.

Herein below, a method for driving a display apparatus according to the Embodiment 1 will be described with reference to FIGS. 5, 6, and 7A to 7C by taking the driving circuit 10 of the display apparatus 1 illustrated in FIGS. 1 to 4 as an example. The method for driving the display apparatus according to the Embodiment 1 is characterized by, when performing display by the organic EL display element 60, applying a voltage based on display data that is data for the display in each one of the plurality of pixels 3 between the gate and the source of the first transistor 21 that changes the current flowing through the organic EL display element 60 and electrically separating the first bus line 41 to be set to have a potential based on the display data and the liquid crystal display element 50 by using the second transistor 22 connected to the pixel electrode 51 of the liquid crystal display element 50. In addition, the method for driving the display apparatus according to the Embodiment 1 is characterized by, when performing display by the liquid crystal display element 50, electrically connecting the first bus line 41 and the pixel electrode 51 by turning on the second transistor 22 as well as the third transistor 23, which is provided between the second transistor 22 and the first bus line 41. Further, the method for driving the display apparatus according to the Embodiment 1 is characterized by, in switching from the display by the liquid crystal display element 50 to the display by the organic EL display element 60, reducing the potential difference between the pixel electrode 51 and the counter electrode 53 of the liquid crystal display element 50 before the second transistor 22 is changed from the ON state to the OFF state. First, an operation in the switching from the display by the LC element 50 to the display by the EL element 60 will be described with reference to FIG. 5 and FIG. 4 described above.

Figure 5:
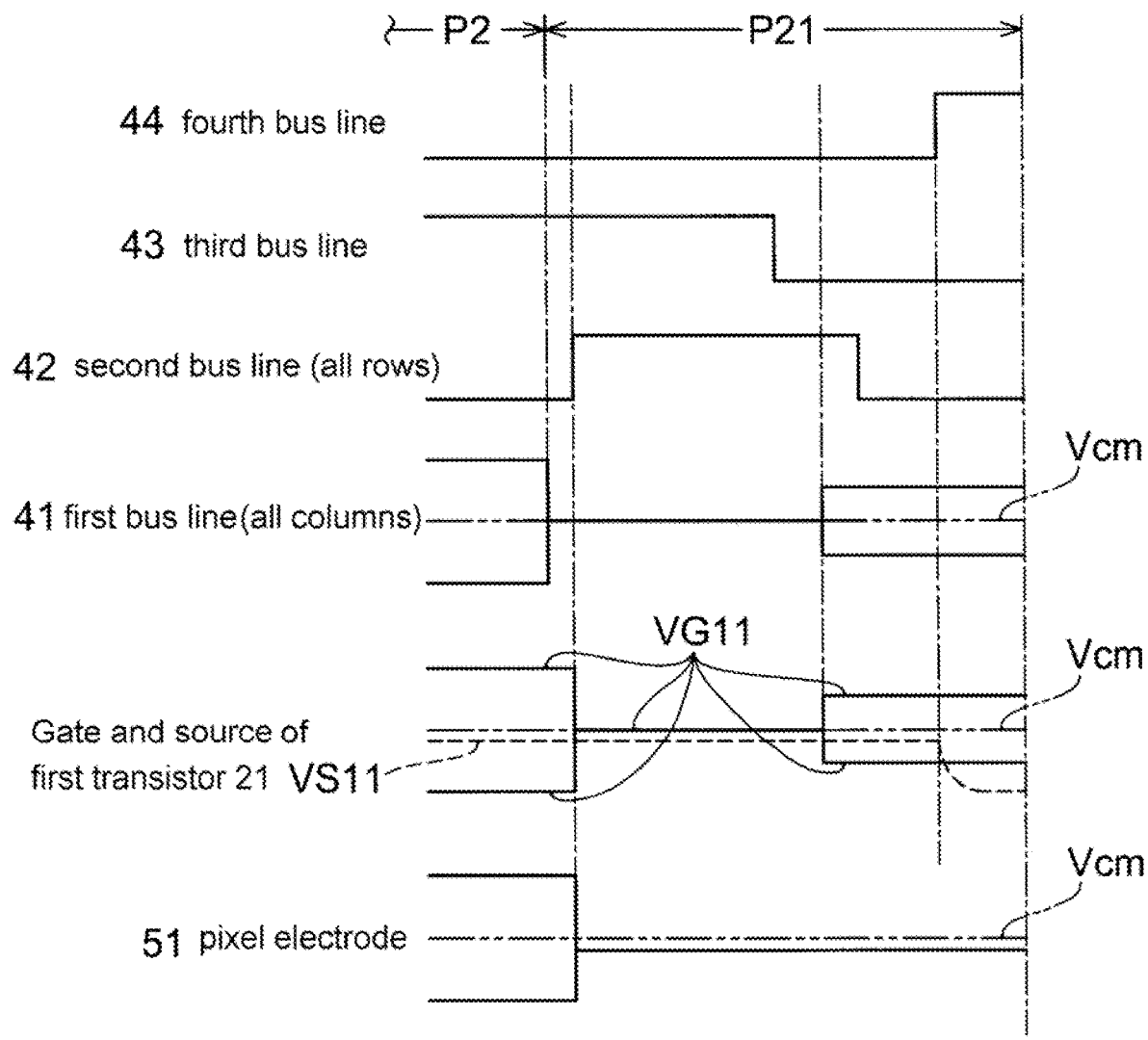
FIG. 5 is a timing chart illustrating an example of the operation during the period of switching from the display by an LC element to the display by an EL element in a method for driving the display apparatus according to the Embodiment 1 of the present invention.

FIG. 5 illustrates an operation during a period P21 of switching from a period P2 of display by the LC element 50 to the display by the EL element 60 (which may be simply referred to as "switching period P21", hereinafter) in the method for driving the display apparatus according to the present embodiment. As illustrated in FIG. 5, the pixel electrode 51 of the LC element 50 is held at an arbitrary potential different from the potential of the counter electrode 53 (refer to FIG. 4), more specifically, potential Vcm of the COM line, during the period P2 of display by the LC element 50, and the display operation by the LC element 50 is performed based on the potential difference between these electrodes. In the next switching period P21, the potential difference between the pixel electrode 51 and the counter electrode 53 is set to be smaller than that during the period P2 of display by the LC element 50. The potential of the pixel electrode 51 is, for example, set to be substantially the same as the potential of the counter electrode 53, more specifically, the potential Vcm of the COM line. The potential difference between these electrodes is preferably set to substantially zero.

As illustrated in FIG. 5, the reduction of the potential difference between the pixel electrode 51 and the counter electrode 53 is performed before the third bus line 43 is set to the low level. In FIG. 5, high levels of the second and third bus lines 42 and 43 are potentials higher than the threshold values at which the third transistor 23 and the second transistor 22 are turned on respectively, and low levels are potentials lower than the threshold values. Further, in FIG. 5, the current supply to the EL element 60 and stop the current supply by the current cut-off circuit 11 (refer to FIG. 4) are illustrated as high and low level of the fourth bus line 44 (however, unlike the example illustrated in FIG. 4, the current cut-off circuit 11 is controlled via a signal line other than the third bus line 43). In each timing chart other than FIG. 5, a description method similar to that in the above description is used.

As mentioned above, in the period P2 of display by the LC element 50, the display operation by the LC element 50 is performed based on the potential difference between the pixel electrode 51 and the counter electrode 53 of the LC element 50. Accordingly, in that state, if the display apparatus 1 shifts to a period P1 of display by the EL element 60, there is a possibility that the LC element 50 continues the display operation and influences the display by the EL element 60. Accordingly, in the method for driving the display apparatus according to the present embodiment, before transition into the period P1 of display by the EL element 60, the potential difference between the pixel electrode 51 and the counter electrode 53 is controlled to be smaller. Preferably, the potential difference is set to substantially zero. By doing so, it is possible to cause the LC element 50 to display a black picture during the period of display by the EL element 60.

According to the example illustrated in FIGS. 5 and 6, in the switching period P21, the potential difference between the pixel electrode 51 and the counter electrode 53 is reduced by once setting the potential of the first bus line 41 to be substantially the same as the potential of the counter electrode 53, namely the potential Vcm of the COM line. More specifically, while the third bus line 43 is held at the high level (i.e. the second transistor 22 is in the ON state), the potential of the first bus line 41 of all columns of the pixel matrix constituted by the plurality of pixels 3 arranged in the matrix pattern is set to be substantially the same as the potential Vcm of the COM line. In the period P2 of display by the LC element 50, since the first bus line 41, the gate potential VG11 of the first transistor 21, and the potential of the pixel electrode 51 can take arbitrary values, lines representing these potentials respectively are depicted on both higher and lower sides of the potential Vcm of the COM line.

Then, by setting the second bus line 42 to the high level in all rows of the pixel matrix, the third transistor 23 is turned on. As a result, the potential of the pixel electrode 51, together with the gate potential VG11 of the first transistor 21, becomes substantially the same as the potential of the first bus line 41, that is, the potential Vcm of the COM line.

Subsequently, the third bus line 43 and the second bus line 42 are set to the low levels. If necessary, the first bus line 41 can be also set an arbitrary potential. In the example illustrated in FIGS. 5 and 6, since the first bus line 41 is changed from the potential Vcm to another potential after the third bus line 43 is set to the low level, the pixel electrode 51 continuously maintains the potential identical to the potential Vcm. On the other hand, the gate potential VG11 of the first transistor 21 varies according to a variation in the potential of the first bus line 41. At this time, the potential of the first bus line 41 (and the gate potential VG11 of the first transistor 21) is desirably set to a value whose absolute value is greater than the threshold voltage of the first transistor 21. By doing so, when the fourth bus line 44 is next changed to the high level and a power source voltage is applied, current flows through the EL element 60 via the first transistor 21 serving as a driving transistor and the electric charge stored in a parasitic capacitor of the EL element 60 is discharged, and a source potential VS11 of the first transistor 21 slowly reaches the zero potential. Unlike the example illustrated in FIGS. 5 and 6, the second bus line 42 may be set to the low level earlier than the third bus line 43. The pixel electrode 51 may be set to have a potential other than the potential Vcm of the COM line in order to reduce the potential difference between the pixel electrode 51 and the counter electrode 53. The pixel electrode 51 may be set to have an arbitrary potential at which the LC element 50 can realize black display not influencing the display by the EL element 60.

When the fourth bus line 44 becomes high level, the current supply to the EL element 60 is started, and when the source potential VS11 of the first transistor 21 sufficiently reaches the zero potential, the switching period P21 ends.

Herein below, an operation of the driving circuit 10 during the period of display by the EL element 60 will be described with reference to FIG. 6 and FIG. 4 described above. FIG. 6 illustrates an example of the operation in which a voltage based on display data of each one of the plurality of pixels 3 is applied between the gate and the source of the first transistor 21 during the period P1 of display by the EL element 60. As illustrated in FIG. 6, in the period P1 of display by the EL element 60, the third bus line 43 is set to the low level, and the first bus line 41 and the LC element 50 are electrically separated by the second transistor 22. Current is supplied to the EL element 60 from the fourth bus line 44.

As illustrated in FIG. 6, in the period P1 of display by the EL element 60, first, the first bus line 41 of each column of the pixel matrix is set the zero potential (e.g., the ground potential identical to the potential of the cathode 63 (refer to FIG. 4) of the EL element 60), and then the second bus line 42 in the first row is set to the high level (i.e. the third transistor 23 is set to the ON state) (at time t0). The auxiliary capacitor C1 for the EL element and the parasitic capacitor (not illustrated) of the EL element 60 are discharged, and both the gate potential VG11 and the source potential VS11 of the first transistor 21 in the first row become zero potential.

Next, the first bus line 41 is set to a potential VA (at time t1) (VA>threshold voltage VT1 of the first transistor 21, and, (VA−VT1)<forward voltage Vf of the EL element 60). The gate potential VG11 of the first transistor 21 rises up to substantially the same potential as the potential VA. In addition, since VA>VT1, current flows between the drain and the source of the first transistor 21, the parasitic capacitor (not shown) of the EL element 60 is charged, and the source potential VS11 of the first transistor 21 rises up to VA−VT1 (since (VA−VT1)<Vf, the EL element 60 does not emit light). Accordingly, a gate-source voltage VGS of the first transistor 21 becomes VT1. Subsequently, the first bus line 41 is set to a potential. VB higher than the potential VA (at time t2). The gate potential VG11 of the first transistor 21 substantially rises up to the potential VB, and VGS becomes equal to VB−(VA−VT1). As mentioned above, in the example illustrated in FIG. 6, the voltage (VB−VA+VT1) based on the potentials VA and VB of the first bus line 41 which is set to potential based on the display data, is applied between the gate and the source of the first transistor 21.

Then, when the second bus line 42 is set to the low level (at time t3), thereby, the third transistor 23 is turned off, the gate-source voltage VGS of the first transistor 21 is maintained by the auxiliary capacitor C1 for the EL element. On the other hand, the source potential VS11 of the first transistor 21 rises as the charging of the parasitic capacitor (not shown) of the EL element 60 progresses, and when VS11 exceeds Vf, the EL element 60 emits light. The drain current of the first transistor 21, whose magnitude is determined by VGS=VB−VA+VT1, flows through the EL element 60, and light having the luminance according to the current value is emitted. Since VGS−VT1 is determined by VB−VA, variations in the threshold voltage VT1 of the first transistor 21 are corrected, and the current flowing through the EL element 60 can be controlled by appropriately selecting the potentials VA and VB.

When the application of voltage to the first transistor 21 in the first row terminates, application of voltage to the first transistor 21 of the second and following rows is performed and a first frame display period F1 ends. Similarly, the application of voltage between the gate and the source of the first transistor 21 is performed even in the second and following frames. In the method for driving the display apparatus according to the present embodiment, since the first bus line 41 and the LC element 50 are electrically separated, it is possible to use a control method advantageous from the viewpoint of the correction for variation of the first transistor 21 as mentioned above without necessity of considering influence on the LC element 50. The pixel electrode 51 of the LC element 50 maintains the potential having been set in the switching period P21, during the period of display by the EL element 60. For example, the potential of the pixel electrode 51 is substantially the same as the potential of the counter electrode 53.

Figure 7A:
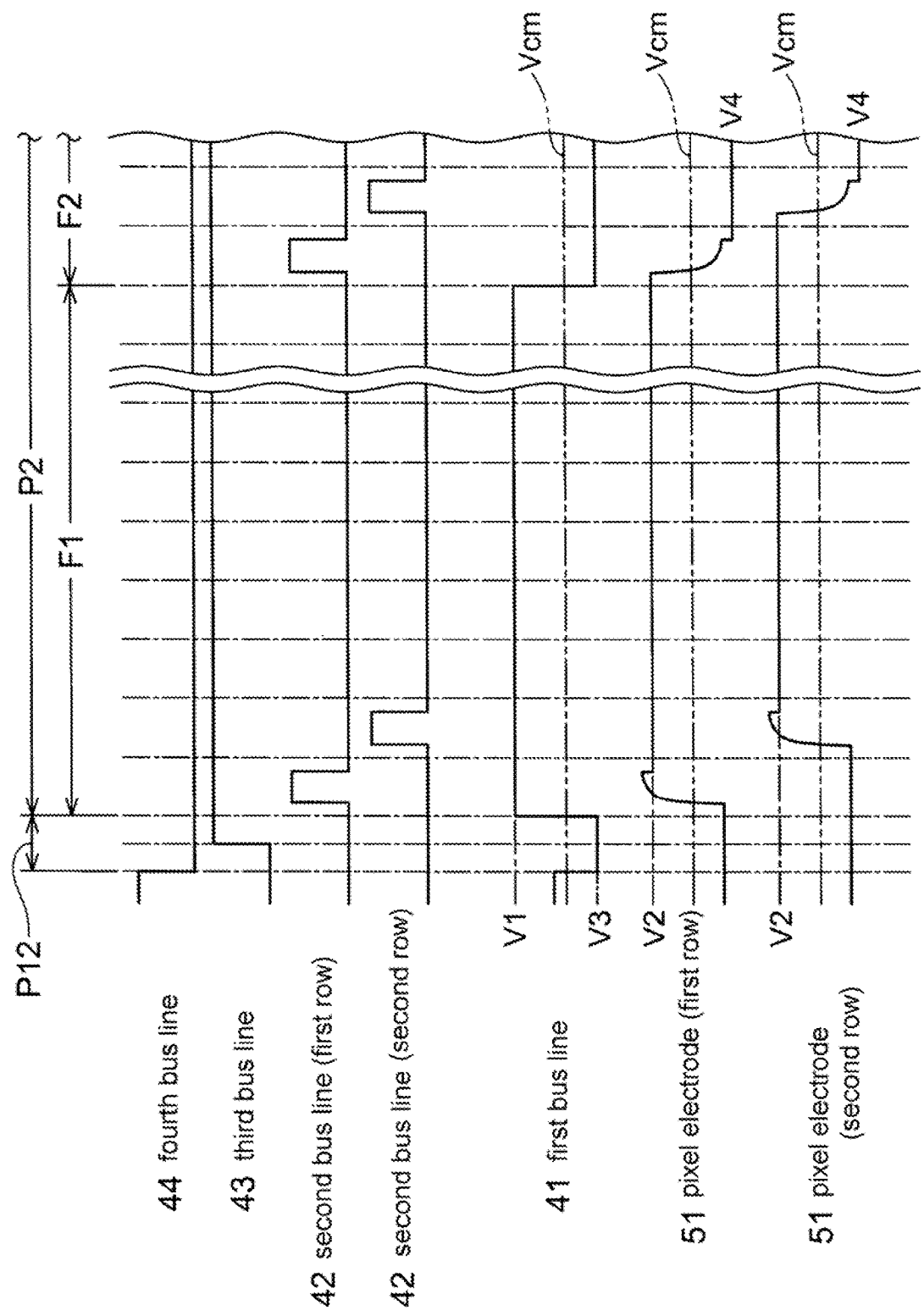
FIG. 7A is a timing chart illustrating an example of the operation during the period of display by the LC element in the method for driving the display apparatus according to the Embodiment 1 of the present invention.

Herein below, an operation during the period of display by the liquid crystal display element (LC element) 50 will be described with reference to FIGS. 7A to 7C and FIG. 4 described above. FIGS. 7A to 7C illustrate an operation to write the driving voltage to each LC element 50 during the period of display by the LC element 50. In addition, FIG. 7A illustrates an example of the operation in a frame inversion method in which the polarity of the voltage applied to the LC element 50 of all pixels is switched for each frame. FIG. 7B illustrates an example of the operation in a dot inversion method in which the polarity of the voltage applied to the LC element 50 of neighboring pixels is alternately switched for each frame. In addition, FIG. 7C illustrates an example of the operation in a frame inversion method to be performed while the potential of the counter electrode 53 is changed between two potentials for each frame. Since the light emission of the EL element 60 can be stopped by providing the current cut-off circuit 11, it is possible to easily use such an inversion driving method in the display by the LC element 50.

As illustrated in FIG. 7A, first, the current supply from the fourth bus line 44 to the EL element 60 is stopped by the current cut-off circuit 11 (FIGS. 7A to 7C illustrate examples in which the current cut-off circuit 11 is controlled via a signal line other than the third bus line 43). In addition, by setting the third bus line 43 to the high level, the LC element 50 and the third transistor 23 are electrically connected. The period P12 is a switching period from the display by the EL element 60 to the display by the LC element 50. The period F1 is a display period of the first frame (first picture), and a period F2 is a display period of the second frame following the first frame.

In the period P2 of display by the LC element 50, the first bus line 41 is set to a desired potential based on the voltage applied to the LC element 50. In the period F1, the first bus line 41 is set to a potential higher than the potential Vcm of the COM line CM. In FIG. 7A, the first bus line 41 is set to the potential V1. Subsequently, the second bus line 42 disposed in the first row of the pixel matrix is set to the high level, the first bus line 41 of each column and the pixel electrode 51 of the LC element 50 in the first row of each column are electrically connected via the second transistor 22 and the third transistor 23 that are in the ON state, and the potential of the pixel electrode 51 changes to substantially the same potential as the potential of the first bus line 41. Subsequently, when the second bus line 42 is set to the low level and the third transistor 23 is turned off, the potential of the pixel electrode 51 is maintained at a potential V2 by the capacitive component of the LC element 50 and the function of the auxiliary capacitor C2 for the LC element during at least the period F1, although it somewhat decreases by the influence of the parasitic capacitor. In this manner, a differential voltage between V2 and Vcm is written to the LC element 50 of the first row. Subsequently, the potential of the second bus line 42 in the second row is set to the high level, and writing to the LC element 50 in the second row is performed in a similar procedure. Writing to all the LC elements 50 is performed sequentially, and the first frame ends. Although the first bus line 41, naturally, can be changed to a desired potential in accordance with the transition of the row to be written, the first bus line 41 in the example illustrated in FIG. 7A is set to the same potential throughout one frame.

Even in the second frame, writing to the LC element 50 is performed similarly. However, in the second frame, the first bus line 41 is set to have a potential V3 lower than Vcm and the potential of the pixel electrode 51 is maintained at a potential V4 further lower than V3. Accordingly, a differential voltage between V4 and Vcm having the polarity opposite to the first frame is written to each LC element 50. In this manner, the display by the LC element 50 using the frame inversion method is performed. The potentials V1 and V3 may be the maximum and minimum potentials among potentials that can be set for the first bus line 41 during the period of display by the LC element 50. In that case, the potential V1 may be substantially 6 V and the potential V3 may be substantially 0 V. Further, in that case, the potential V2 may be substantially 5 V, the potential V4 may be substantially −1 V, and Wm may be substantially 2 V.

As illustrated in FIG. 7B, in the dot inversion method, the potential of the first bus line 41 is set in such a manner that the polarity of the potential of the first bus line 41 with respect to the potential Vcm of the COM line is switched between the odd-number row and the even-number row, in one column of the pixel matrix. Further, the potential of the first bus line 41 wired in each column is set in such a manner that even in one row, the polarity of the potential of the first bus line 41 with respect to the potential Vcm of the COM line is switched between the odd-number column and the even-number column. Then, the potential of each first bus line 41 is set in such a manner that the polarity of the potential applied to the pixel electrode 51 of the same LC element 50 with respect to the potential Vcm is inversed between two consecutive frames. By using such a dot inversion method, for example, the flickering or the like in a picture that may be caused by the inversion driving can be reduced. The switching timings of the second to fourth bus lines 42 to 44 and the potential of the pixel electrode 51 are similar to those illustrated in FIG. 7A, and therefore the description thereof is omitted.

As illustrated in FIG. 7C, in the frame inversion method to be performed while the potential of the counter electrode 53 is changed between two potentials for each frame, the potential Vcm is changed for each frame although the setting of the potential of the first bus line 41 is performed similarly as the example of FIG. 7A described above. In the example illustrated in FIG. 7C, the potential Vcm is set to a potential V5 in the first frame and is set to a potential V6 in the second frame. On the other hand, the potential of the first bus line 41 is set to a desired potential V7 higher than the potential V5 in the first frame and is set to a desired potential V9 lower than the potential V6 in the second frame. In the first frame, a voltage difference between a potential V8 (having been lowered from the potential V7 due to the influence of the parasitic capacitor) higher than the potential Vcm and the potential Vcm is written to the LC element 50. Further, in the second frame, a voltage difference between a potential V10 (having been lowered from the potential V9 due to the influence of the parasitic capacitor) lower than the potential Vcm and the potential Vcm is written to the LC element 50. By using such a driving method, even when the range of potential that can be set for the first bus line 41 is narrow, it is possible to obtain a large voltage for writing to the LC element 50. Accordingly, there is a case where a general-purpose and inexpensive device can be used as means for generating the potential of the first bus line 41 (e.g., the data line driver 13 (refer to FIG. 1)). The potential V5 may be substantially −1 V, and the potential V6 may be substantially 2 V. In addition, the potentials V7 and V9 may be the maximum and minimum potentials among potentials that can be set for the first bus line 41 during the period of display by the LC element 50 in the exemplary driving method illustrated in FIG. 7C. In that case, the potential V7 may be substantially 3 V, and the potential V9 may be substantially 0 V. In addition, in that case, the potential V8 may be substantially 2 V and the potential V10 may be substantially −1 V. The switching timings of the second to fourth bus lines 42 to 44 are similar to those illustrated in FIG. 7A and therefore the description thereof is omitted.

In the present embodiment, since the light emission of the EL element 60 can be stopped by providing the current cut-off circuit 11, it is possible to easily use various inversion driving methods in the display by the LC element 50. A so-called 1H inversion method in which the polarity of the voltage to be written to the LC element 50 is inverted for each row between respective frames, or a so-called column inversion method for causing inversion for each column, may be used. It is possible to prevent burning of the LC element 50 by using an appropriate inversion driving method according to the use of the display apparatus 1.

Figure 8A:
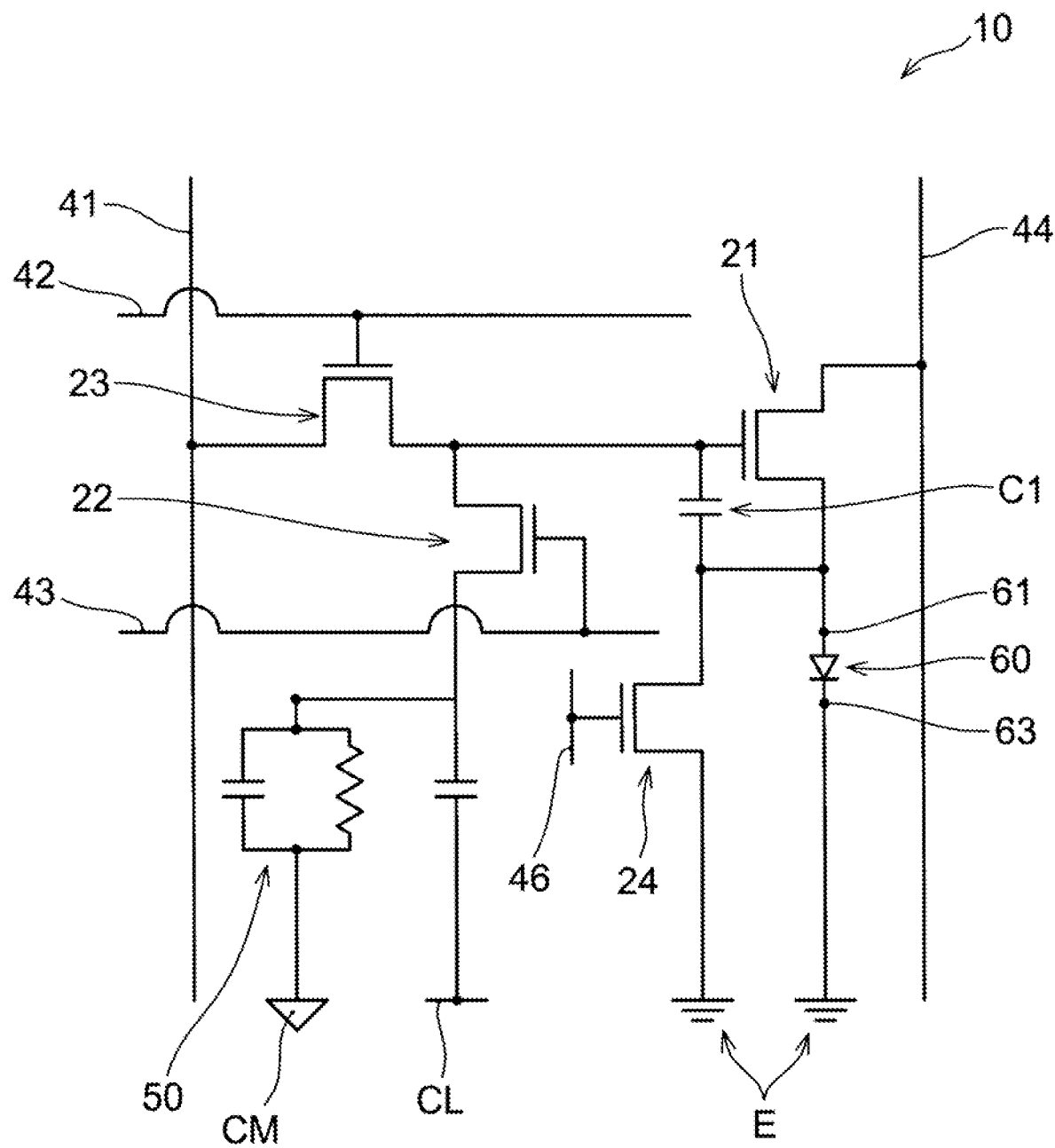
FIG. 8A is a view illustrating a first modified example of the driving circuit of the display apparatus according to the Embodiment 1 of the present invention.

Herein below, modified examples of the display apparatus 1 according to the present embodiment will be described with reference to attached drawings. FIG. 8A illustrates a first modified example of the driving circuit 10 of the display apparatus 1 according to the present embodiment. As illustrated in FIG. 8A, in the first modified example of the driving circuit 10, each one of the plurality of pixels 3 (refer to FIG. 1) further includes a fourth transistor 24 connected in parallel with the organic EL display element 60. In the example illustrated in FIG. 8A, the fourth transistor 24 is an n-channel field effect transistor (n-FET), and a drain thereof is connected to the source of the first transistor 21 that is the n-FET, the anode 61 of the organic EL display element 60, and one end of the auxiliary capacitor C1 for the EL element. Further, a source of the fourth transistor is connected to a ground line E together with the cathode 63 of the EL element 60, and a gate thereof is connected to a sixth bus line 46. The sixth bus line 46 is, for example, connected to the scanning line driver 12 (refer to FIG. 1). The first modified example illustrated in FIG. 8A is the same as the example of the driving circuit 10 illustrated in FIG. 3 except for including the fourth transistor 24. The constituent elements similar to those in the example illustrated in FIG. 3 are denoted by the same reference numerals, and the description thereof is omitted.

As illustrated in FIG. 8B, the first modified example illustrated in FIG. 8A is different from the above-described example illustrated in FIGS. 3 and 6 in that, in the switching period P21, the sixth bus line 46 is set to the high level and the fourth transistor 24 is turned on and the source of the first transistor 21 is connected to the ground line E via the fourth transistor 24.

First, while the third bus line 43 is at the high level, the sixth bus line 46 is set to the high level together with the second bus line 42, and the third transistor 23 and the fourth transistor 24 are turned on, thereby the source of the first transistor 21 is connected to the ground line E via the fourth transistor 24. Accordingly, the electric charge stored in the parasitic capacitor (not illustrated) of the EL element 60 is discharged, and the source potential VS11 of the first transistor 21 becomes zero potential. At this time, the potential of the first bus line 41 is substantially the same potential as Vcm. The gate potential VG11 of the first transistor 21 and the potential of the pixel electrode 51 of the LC element 50 become substantially the same potential as Vcm, and the remaining charge of the LC element 50 is discharged. Subsequently, the third bus line 43 is tuned to the low level, the LC element 50 is electrically separated from other constituent elements, and the potential of the pixel electrode 51 is held at substantially Vcm.

Thereafter, the potential of the first bus line 41 is set to an arbitrary potential if necessary, and the gate potential VG11 of the first transistor 21 becomes a potential following the potential of the first bus line 41. At this time, according to the example illustrated in FIGS. 3 and 6, the potential of the first bus line 41 is preferably set to a value slightly larger than threshold voltage of the first transistor 21, and the source potential VS11 of the first transistor 21 is dropped to the zero potential by allowing current to flow through the first transistor 21. On the other hand, in the example illustrated in FIGS. 8A and 8B, since the source potential VS11 is initially dropped to the potential of the ground line E (the zero potential) by the sixth bus line 46, it is possible to set the potential of the first bus line 41 to a value whose absolute value is smaller than the threshold voltage of the first transistor 21. By doing so, since the first transistor 21 is turned off, it is possible to suppress the EL element 60 from unnecessarily emitting light at the moment when the power source voltage is applied upon turning of the fourth bus line 44 to the high level in the switching period P21. As mentioned above, by further including the fourth transistor 24 connected in parallel with the organic EL display element 60, it is possible to set the source potential VS11 of the first transistor 21 to the zero potential, more surely and in a short time, and it is possible to accurately control the driving current of the EL element 60. In addition, it is possible to prevent the EL element 60 from unnecessarily emitting light at the moment of switching to the display by the EL element 60. Since the timing chart illustrated in FIG. 8B is the same as the timing chart illustrated in FIG. 6 except for the point described above, the description of other operations is omitted.

Figure 9A:
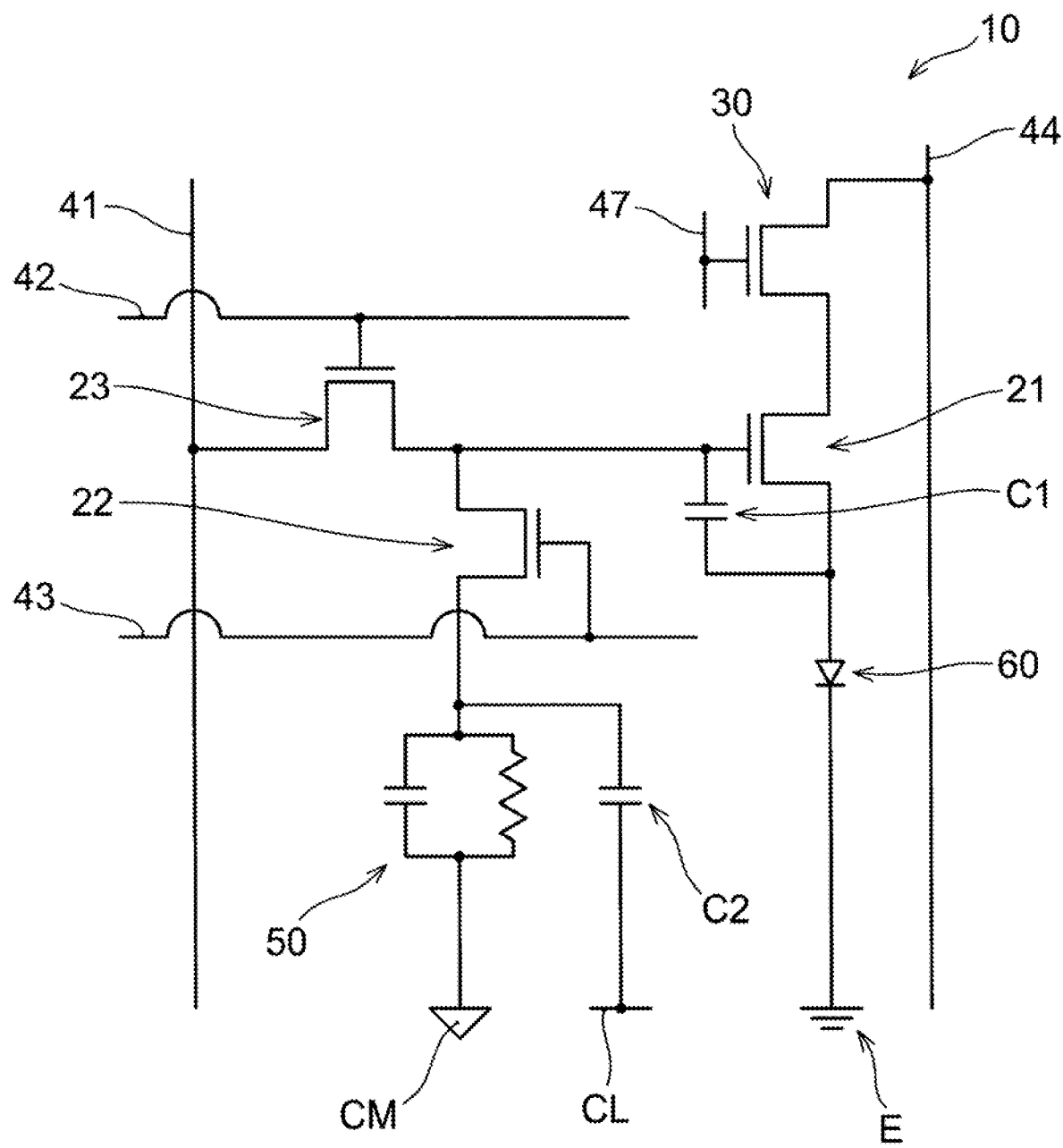
FIG. 9A is a view illustrating a second modified example of the driving circuit of the display apparatus according to the Embodiment 1 of the present invention.

FIG. 9A illustrates a second modified example of the driving circuit 10 of the display apparatus 1 according to the present embodiment. As illustrated in FIG. 9A, in the second modified example of the driving circuit 10, each one of the plurality of pixels 3 (refer to FIG. 1) further includes a tenth transistor 30 connected between the fourth bus line 44 and the first transistor 21. In the example illustrated in FIG. 9A, the tenth transistor 30 is an n-channel field effect transistor (n-FET), which has a drain connected to the fourth bus line 44 and a source connected to the drain of the first transistor 21. Then, a gate of the tenth transistor 30 is connected to a seventh bus line 47. The seventh bus line 47 is, for example, connected to the scanning line driver 12 (refer to FIG. 1). The tenth transistor 30 may be a field effect transistor constituting the above-mentioned current cut-off circuit 11 (refer to FIG. 4). The second modified example illustrated in FIG. 9A is the same as the example of the driving circuit 10 illustrated in FIG. 3 except for including the tenth transistor 30. The constituent elements similar to those in the example illustrated in FIG. 3 are denoted by the same reference numerals, and the description thereof is omitted.

As illustrated in FIG. 9B, the second modified example illustrated in FIG. 9A is different from the above-described examples illustrated in FIGS. 3 and 4 in that, in the switching period P21, the seventh bus line 47 is set to the high level and the tenth transistor 30 is turned on, and the power source voltage of the fourth bus line 44 is applied to the drain of the first transistor 21.

First, while the third bus line 43 is at the high level, the second bus line 42 at all rows is set to the high level, and the potential of the first bus line 41, which is set to substantially the same potential as the potential Vcm of the COM line, is applied to the gate of the first transistor 21. The gate potential VG11 of the first transistor 21 and the potential of the pixel electrode 51 of the LC element 50 become substantially the same potential as Vcm, and the remaining charge of the LC element 50 is discharged. Subsequently, the third bus line 43 is tuned to the low level and the second transistor 22 is turned off, and the LC element 50 is electrically separated from other constituent elements and the potential of the pixel electrode 51 is held at Vcm.

Thereafter, the potential of the first bus line 41 is set to an arbitrary potential if necessary, and the gate potential VG11 of the first transistor 21 becomes a potential following the potential of the first bus line 41. At this time, it is desirable that the potential of the first bus line 41 (and the gate potential VG11 of the first transistor 21) is set to a value whose absolute value is greater than the threshold voltage of the first transistor 21. In such a case, when the seventh bus line 47 and the fourth bus line 44 are next set to the high level and the power source voltage is supplied, current flows through the EL element 60 via the first transistor 21 serving as the driving transistor and the electric charge stored in the parasitic capacitor of the EL element 60 is discharged, and the source potential VS11 of the first transistor 21 slowly reaches the zero potential. As mentioned above, by further including the tenth transistor 30 controlling connection to the power source voltage, it is possible to freely control the light-emitting state (ON/OFF of the EL element 60, and it is possible to represent arbitrary grayscale more accurately. Since the timing chart illustrated in FIG. 9B is the same as the timing chart illustrated in FIG. 6 except for the above-described point and therefore the description of other operations is omitted.

Figure 10A:
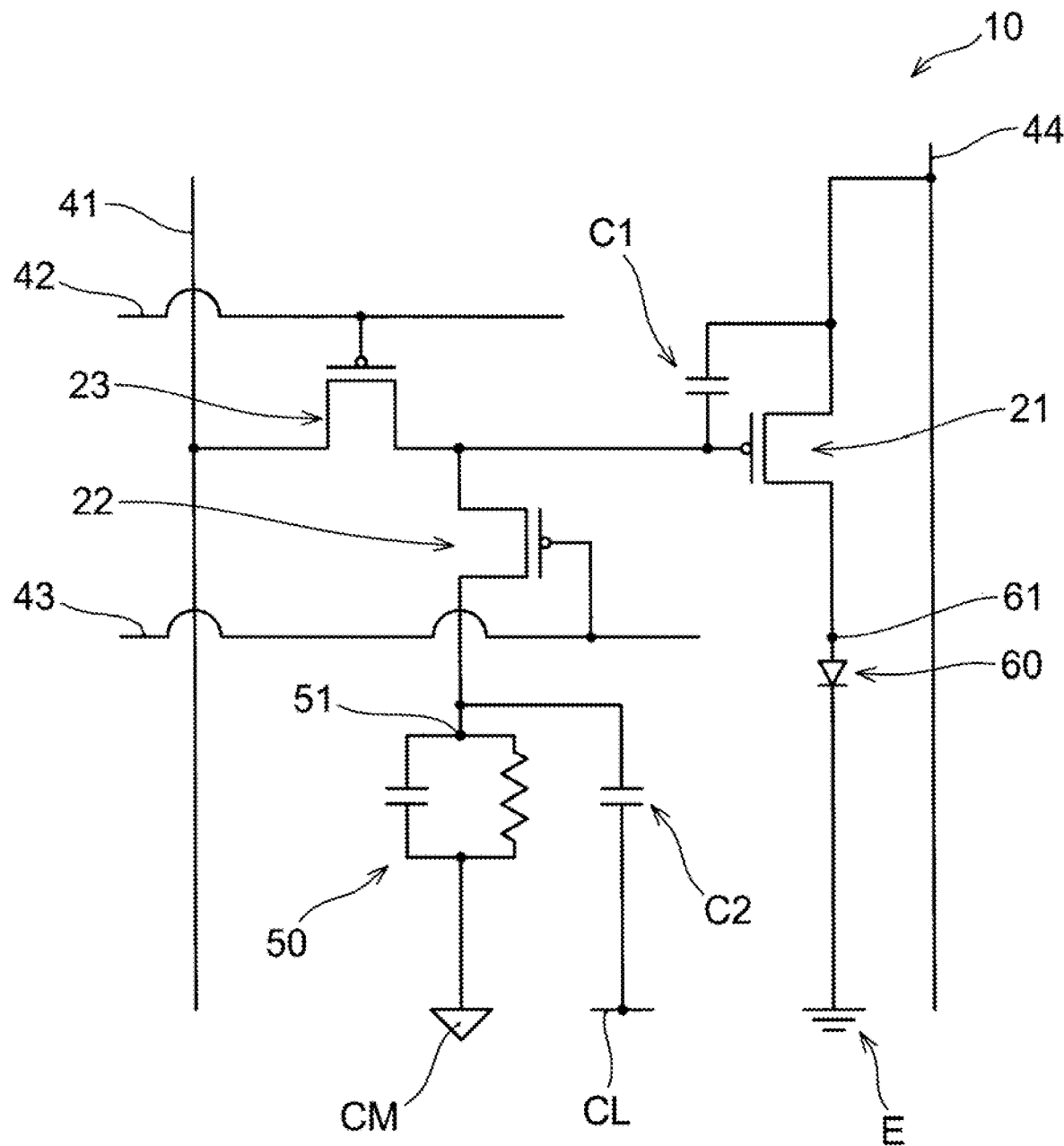
FIG. 10A is a view illustrating a third modified example of the driving circuit of the display apparatus according to the Embodiment 1 of the present invention.

FIG. 10A illustrates a third modified example of the driving circuit 10 of the display apparatus 1 according to the present embodiment. As illustrated in FIG. 10A, the third modified example of the driving circuit 10 is different from the example illustrated in FIG. 3 in that the first transistor 21, the second transistor 22, and the third transistor 23 are p-channel field effect transistors (p-FETs). Therefore, the drain of the third transistor 23 is connected to the gate of the first transistor 21 and the source of the second transistor 22. The source of the third transistor 23 is connected to the first bus line 41, and the drain of the second transistor 22 is connected to the pixel electrode 51 of the LC element 50. In addition, the source of the first transistor 21 is connected to the fourth bus line 44, and the drain thereof is connected to the anode 61 of the EL element 60. Accordingly, one end of the auxiliary capacitor C1 for the EL element is connected to the fourth bus line 44 together with the source of the first transistor 21. The third modified example illustrated in FIG. 10A is the same as the example of the driving circuit 10 illustrated in FIG. 3 except that the first to third transistors 21 to 23 are p-FETs. The constituent elements similar to those in the example illustrated in FIG. 3 are denoted by the same reference numerals, and the description thereof is omitted.

Figure 10B:
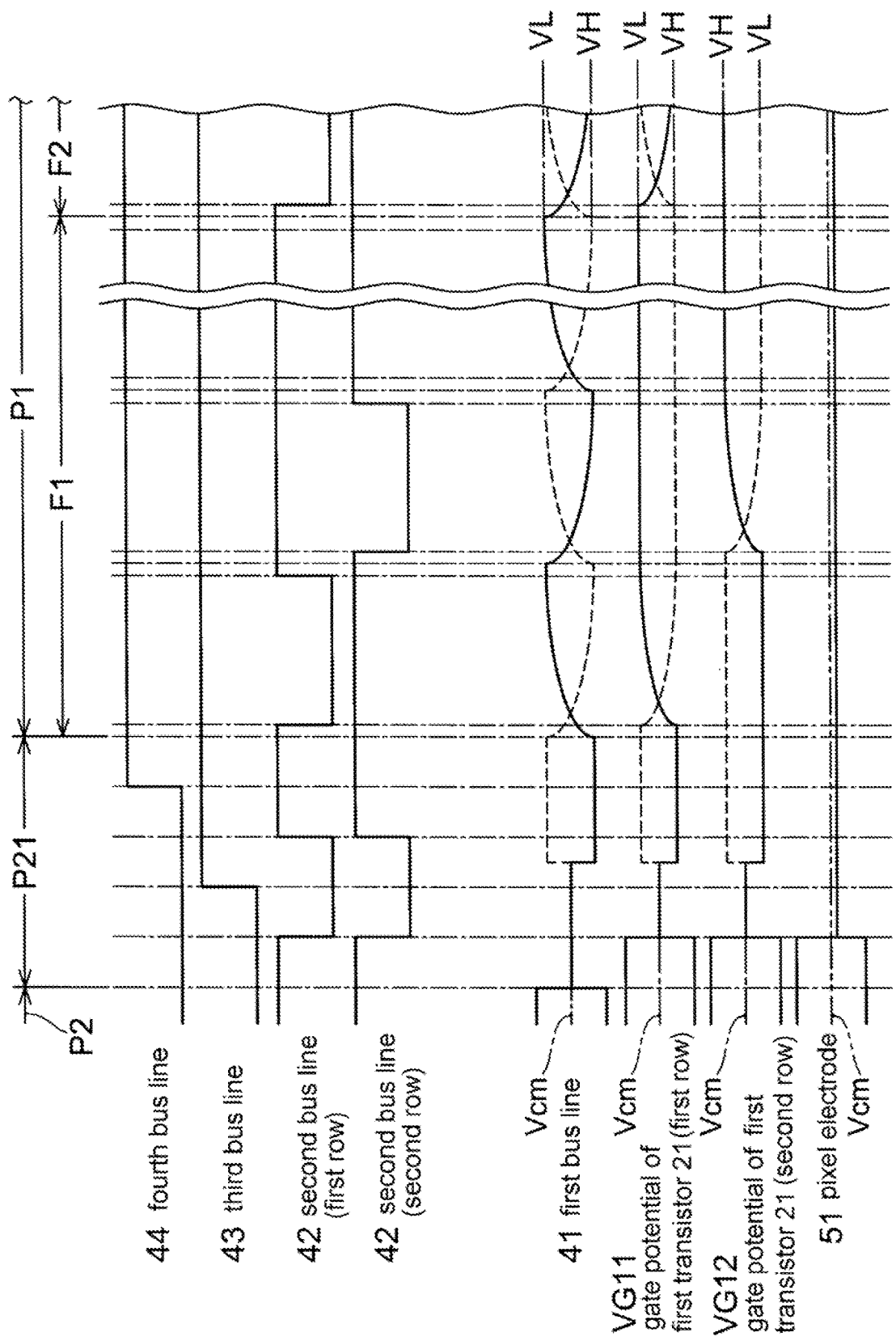
FIG. 10B is a timing chart illustrating an example of the operation by the driving circuit illustrated in FIG. 10A.

FIG. 10B illustrates an operation during the period of display by the EL element 60 in the third modified example of the driving circuit 10 illustrated in FIG. 10A. In a case where the first transistor 21 is a p-FET as illustrated in FIG. 10A and the source thereof is connected to the fourth bus line 44, since the source potential is stabilized, it is possible to use a simple method different from the above-mentioned method for applying the voltage to the first transistor 21 illustrated in FIG. 6. More specifically, as illustrated in FIG. 10B, the first bus line 41 is simply set to a potential to be set to the gate of the first transistor 21 when voltage is applied to the first transistor 21 in each row of the pixel matrix. In FIG. 10B, on a line indicating the potential of the first bus line 41, a potential variation corresponding to a case where the first bus line 41 is set from the high level (VH) to the low level (VL) for each row of the pixel matrix and a potential variation corresponding to a case where it is set from the low level to the high level for each row of the pixel matrix are illustrated to overlap each other (in FIG. 10B, the potential variations are illustrated such that the potential gradually changes due to the influence of the capacitive component between the first bus line 41 and the gate of the first transistor 21). Similarly, on the lines indicating the gate potentials VG11 and VG12 of the first transistor 21 in each row, a potential variation corresponding to a case where each gate potential is set from the high level to the low level and a potential variation corresponding to a case where it is set from the low level to the high level are illustrated to overlap each other. In addition, since the second transistor 22 and the third transistor 23 are p-FETs, when the third bus line 43 and the second bus line 42 are at low levels, the second transistor 22 and the third transistor 23 are turned on respectively.

Figure 11A:
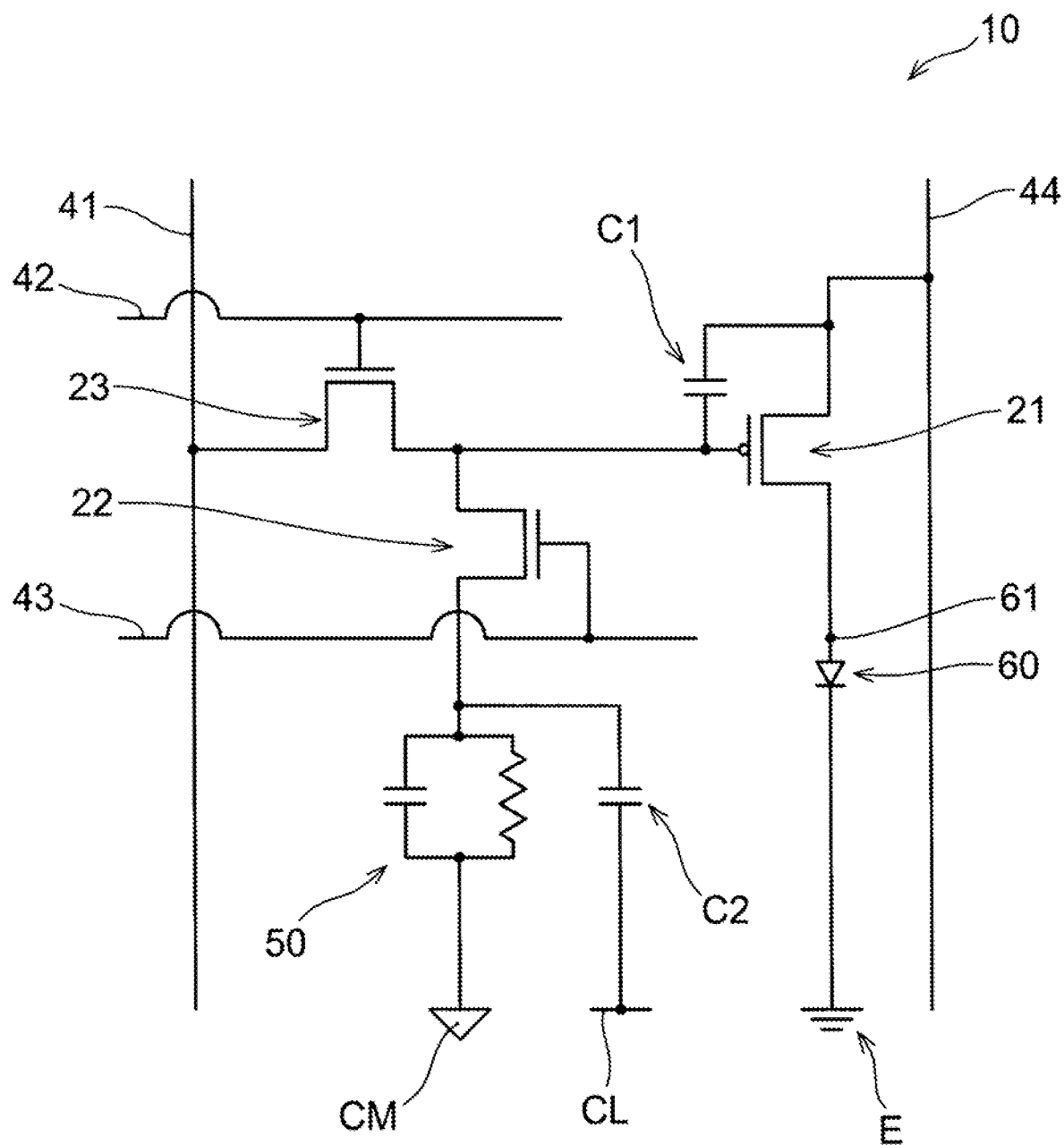
FIG. 11A is a view illustrating a fourth modified example of the driving circuit of the display apparatus according to the Embodiment 1 of the present invention.

FIG. 11A illustrates a fourth modified example of the driving circuit 10 of the display apparatus 1 according to the present embodiment. As illustrated in FIG. 11A, the fourth modified example of the driving circuit 10 is different from the example illustrated in FIG. 3 in that the first transistor 21 is a p-channel field effect transistor (p-FET). Accordingly, the source of the first transistor 21 is connected to the fourth bus line 44 together with one end of the auxiliary capacitor C1 for the EL element, and a drain of the first transistor 21 is connected to the anode 61 of the EL element 60. Similar to the above-described example illustrated in FIG. 10A, since the first transistor 21 is the p-FET, it is possible to use a simple method when applying the voltage to the first transistor 21. On the other hand, since the second and third transistors 22 and 23 are n-channel field effect transistors with higher carrier mobility, it is possible to complete the writing of the driving voltage to the LC element 50 in a short time. The fourth modified example illustrated in FIG. 11A is the same as the example of the driving circuit 10 illustrated in FIG. 3 except that the first transistor 21 is the p-FET. The constituent elements similar to those in the example illustrated in FIG. 3 are denoted by the same reference numerals, and the description thereof is omitted.

Figure 11B:
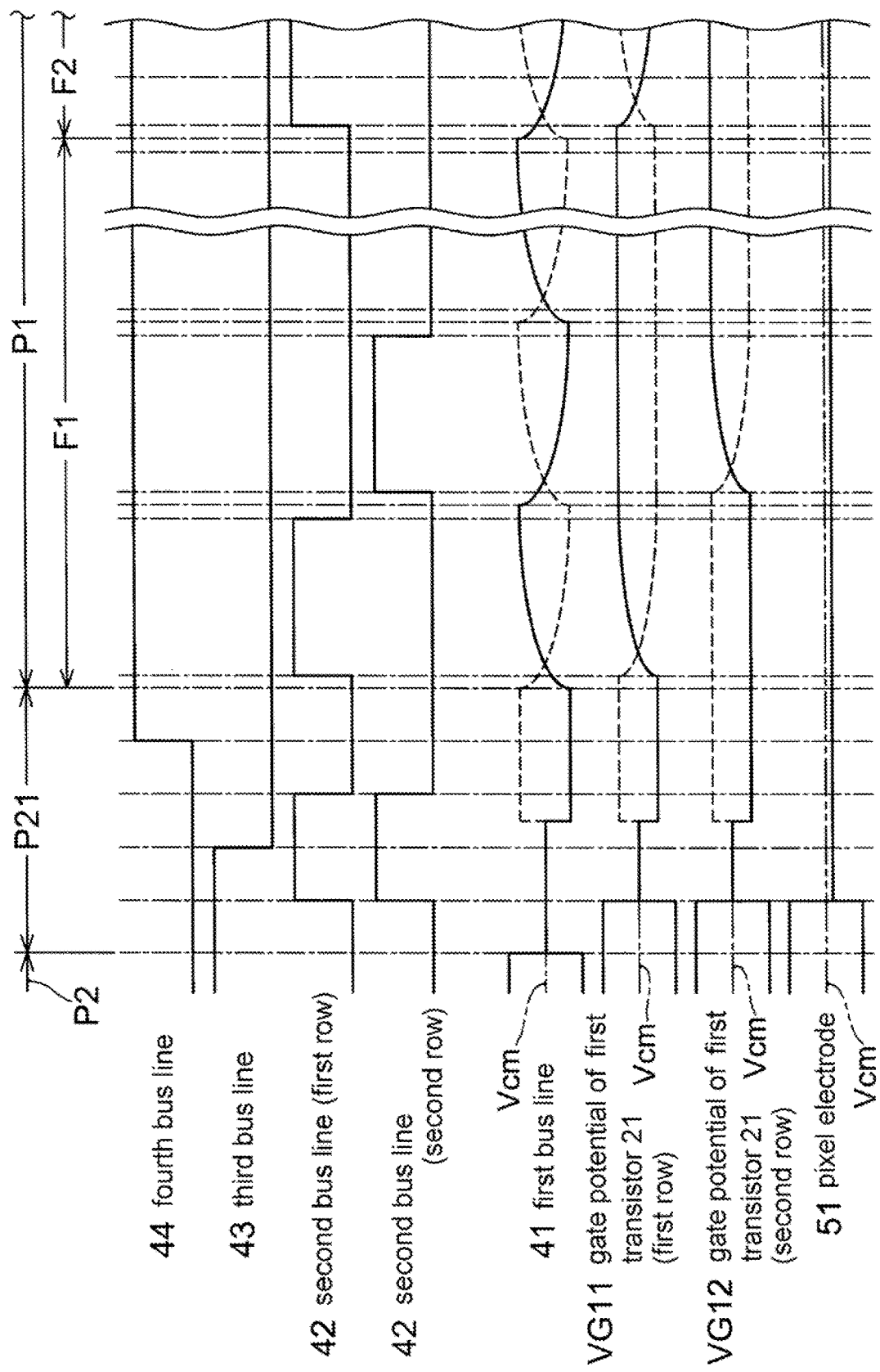
FIG. 11B is a timing chart illustrating an example of the operation by the driving circuit illustrated in FIG. 11A.

As illustrated in FIG. 11B, even in the fourth modified example illustrated in FIG. 11A, similar to the above-described third modified example illustrated in FIG. 10A, the potential to be set for the gate of the first transistor 21 is simply set to the first bus line 41, when applying the voltage to the first transistor 21 in each row of the pixel matrix. Even in the fourth modified example, it is possible to use such a simple application method. In FIG. 11B, when the third bus line 43 and the second bus line 42 are at the high level respectively, the second transistor 22 and the third transistor 23 each being an n-channel field effect transistor are turned on respectively.

Embodiment 2

Figure 12:
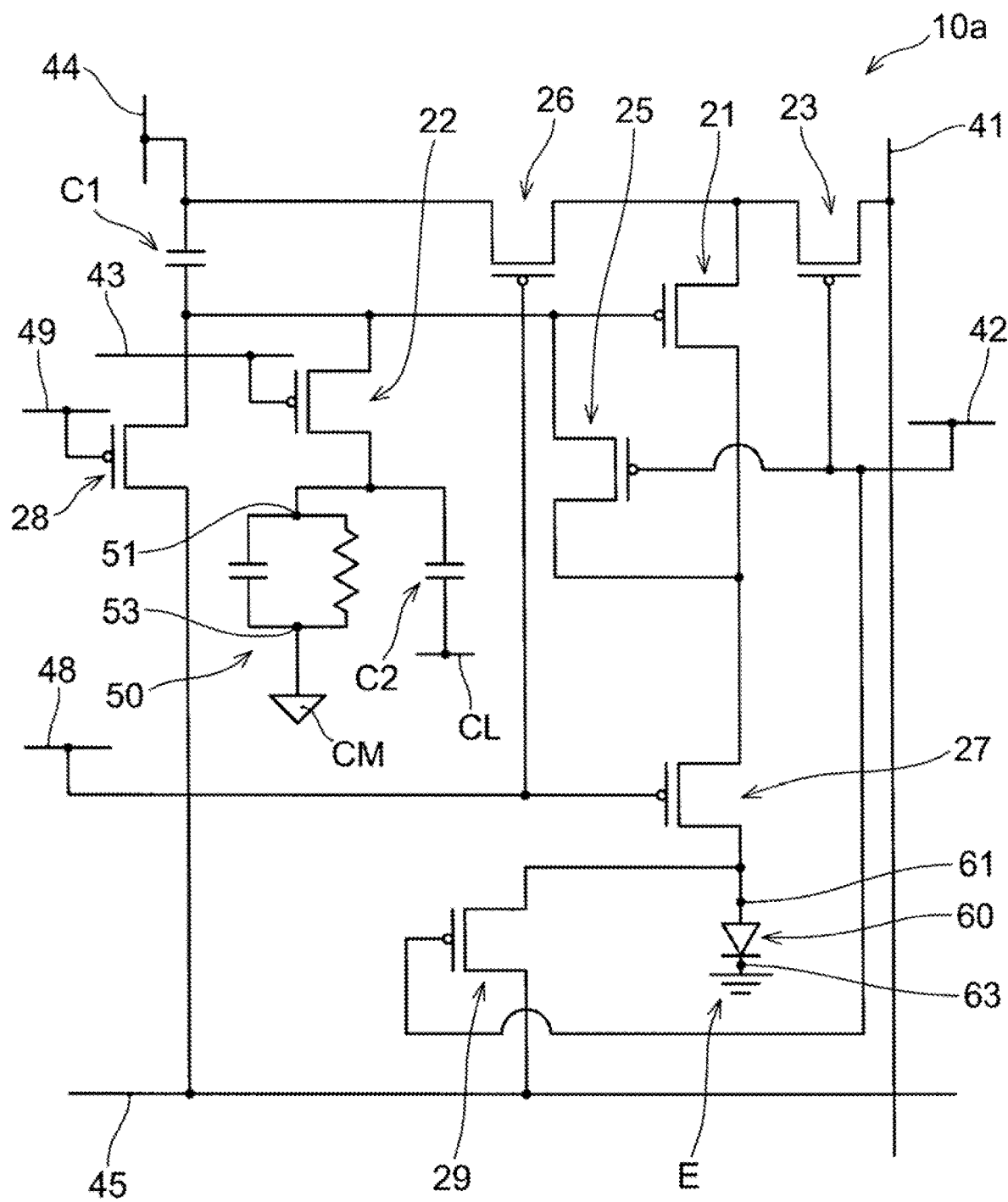
FIG. 12 is a view illustrating an example of the driving circuit for one pixel of a display apparatus according to Embodiment 2 of the present invention.

Herein below, a display apparatus according to Embodiment 2 will be described with reference to attached drawings. The display apparatus according to the Embodiment 2 is different from the display apparatus according to the Embodiment 1 mainly with respect to the driving circuit of each pixel 3. On the other hand, the display apparatus according to the Embodiment 2 is similar to the display apparatus 1 according to the Embodiment 1 illustrated in FIGS. 2 and 1 in the structure thereof and the arrangement of the plurality of pixels 3. Accordingly, a driving circuit 10a according to the Embodiment 2 will be mainly described, and the description of constituent elements similar to those of the Embodiment 1 is omitted. FIG. 12 illustrates an example of the driving circuit 10a.

As illustrated in FIG. 12, the driving circuit 10a according to the present embodiment includes at least the first bus line 41, the second bus line 42, the third bus line 43, and the fourth bus line 44 to supply current to the organic EL display element 60, similar to the above-mentioned driving circuit 10 according to the Embodiment 1. The organic EL display element (EL element) 60 includes the anode 61 and the cathode 63 that are formed so as to be electrically separated from the pixel electrode 51 and the counter electrode 53 of the liquid crystal display element (LC element) 50. The driving circuit 10a, similar to the above-mentioned driving circuit 10, further includes the first transistor 21 that changes the magnitude of the current supplied to the EL element 60 based on the potential of the first bus line 41, the second transistor 22, and the third transistor 23 that electrically connects the first transistor 21 and the second transistor 22 to the first bus line 41 based on the potential of the second bus line 42. Further, in the present embodiment, the first transistor 21, the second transistor 22, and the third transistor 23 are p-channel field effect transistors (p-FETs), the source of the first transistor 21 is connected to the drain of the third transistor 23, and the source of the third transistor 23 and the first bus line 41 are connected. In addition, the gate of the first transistor 21 and the source of the second transistor 22 are connected, and the drain of the second transistor 22 and the pixel electrode 51 of the liquid crystal display element 50 are connected. Further, the driving circuit 10a includes a fifth transistor 25 provided to substantially short-circuit the gate of the first transistor 21 and the drain of the first transistor 21 based on the potential of the second bus line 42. Further, the driving circuit 10a includes a sixth transistor 26 that electrically connects or separates the source of the first transistor 21 and the fourth bus line 44, and a seventh transistor 27 that electrically connects or separates the drain of the first transistor 1 and the anode 61 of the organic EL display element 60.

A drain of the fifth transistor 25 is connected to the gate of the first transistor 21, a source of the fifth transistor 25 is connected to the drain of the first transistor, and a gate of the fifth transistor 25 is connected to the second bus line 42. In addition, a source of the sixth transistor 26 is connected to the fourth bus line 44, and a drain of the sixth transistor 26 is connected to the source of the first transistor 21 together with the drain of the third transistor 23. The auxiliary capacitor C1 for the EL element is connected between the gate of the first transistor 21 and the fourth bus line 44. In addition, a source of the seventh transistor 27 is connected to the drain of the first transistor 21 and the source of the fifth transistor 25, and a drain of the seventh transistor 27 is connected to the anode 61 of the EL element 60. Then, in the example illustrated in FIG. 12, a gate of the sixth transistor 26 and a gate of the seventh transistor 27 are both connected to an eighth bus line 48.

The gate and the source of the first transistor 21 are in a state of so-called diode connection, when the fifth transistor 25 is turned on and the gate and the drain of the first transistor 21 are short-circuited. In that state, a potential based on the first bus line 41 (more specifically, a potential lower than the source potential of the first transistor 21 by the magnitude of the threshold voltage thereof) is set to the gate of the first transistor 21, via the third transistor 23. Accordingly, the first transistor 21 can change the magnitude of current supplied to the EL element 60 based on the potential of the first bus line 41. In addition, since the source and the drain of the first transistor 21 can be diode-connected, the third transistor 23 can electrically connect the source of the second transistor 22 to the first bus line 41 based on the potential of the second bus line 42. Since the threshold voltage can be compensated for the voltage between the gate and the source of the first transistor 21 by using the driving circuit illustrated in. FIG. 12, it is possible to reduce the influence of variations of the threshold voltage and precisely control the current flowing through the EL element 60.

In addition, in the example illustrated in FIG. 12, the plurality of bus lines provided in the display apparatus according to the Embodiment 2 further includes the fifth bus line 45 that is provided in each row of the plurality of pixels 3 (refer to FIG. 1) and is electrically connected to the gate of the first transistor 21 in the initialization of the gate potential of the first transistor 21 described below. In addition, in the example illustrated in FIG. 12, the driving circuit 10a of each one of the plurality of pixels 3 includes an eighth transistor 28 that electrically connects or separates the fifth bus line 45 and the gate of the first transistor 21 and a ninth transistor 29 provided to discharge the organic EL display element 60 based on the potential of the second bus line 42.

More specifically, a source of the eighth transistor 28 is connected to the gate of the first transistor 21 and the source of the second transistor 22, and a drain of the eighth transistor 28 is connected to the fifth bus line 45. In the example illustrated in FIG. 12, a gate of the eighth transistor 28 is connected to the ninth bus line 49. In addition, a source of the ninth transistor 29 is connected to the anode 61 of the EL element 60, and a drain thereof is connected to the fifth bus line 45. By providing the ninth transistor 29, it is possible to prevent the occurrence of display unevenness due to the remaining charge of the organic EL display element 60. In the example illustrated in FIG. 12, a gate of the ninth transistor 29 is connected to the second bus line 42. Further, in the example illustrated in FIG. 12, the fifth to ninth transistors 25 to 29 are all p-channel field effect transistors and the fifth and eighth bus lines 45 and 48 are connected, for example, to the scanning line driver 12 (refer to FIG. 1). The ninth bus line 49, although it may be connected to the scanning line driver 12, is connected to the second scanning line driver 12a (refer to FIG. 1) that is operable independent of the scanning line driver 12 in the present embodiment.

The "initialization" of the gate potential of the first transistor 21 means setting the gate potential of the first transistor 21 to a predetermined initial potential before applying a voltage based on display data between the gate and the source of the first transistor 21. For example, the gate potential of the first transistor 21 is set to the potential of the fifth bus line 45 at the time of initialization. The auxiliary capacitor C1 for the EL element is charged or discharged at the time of initialization.

Figure 13:
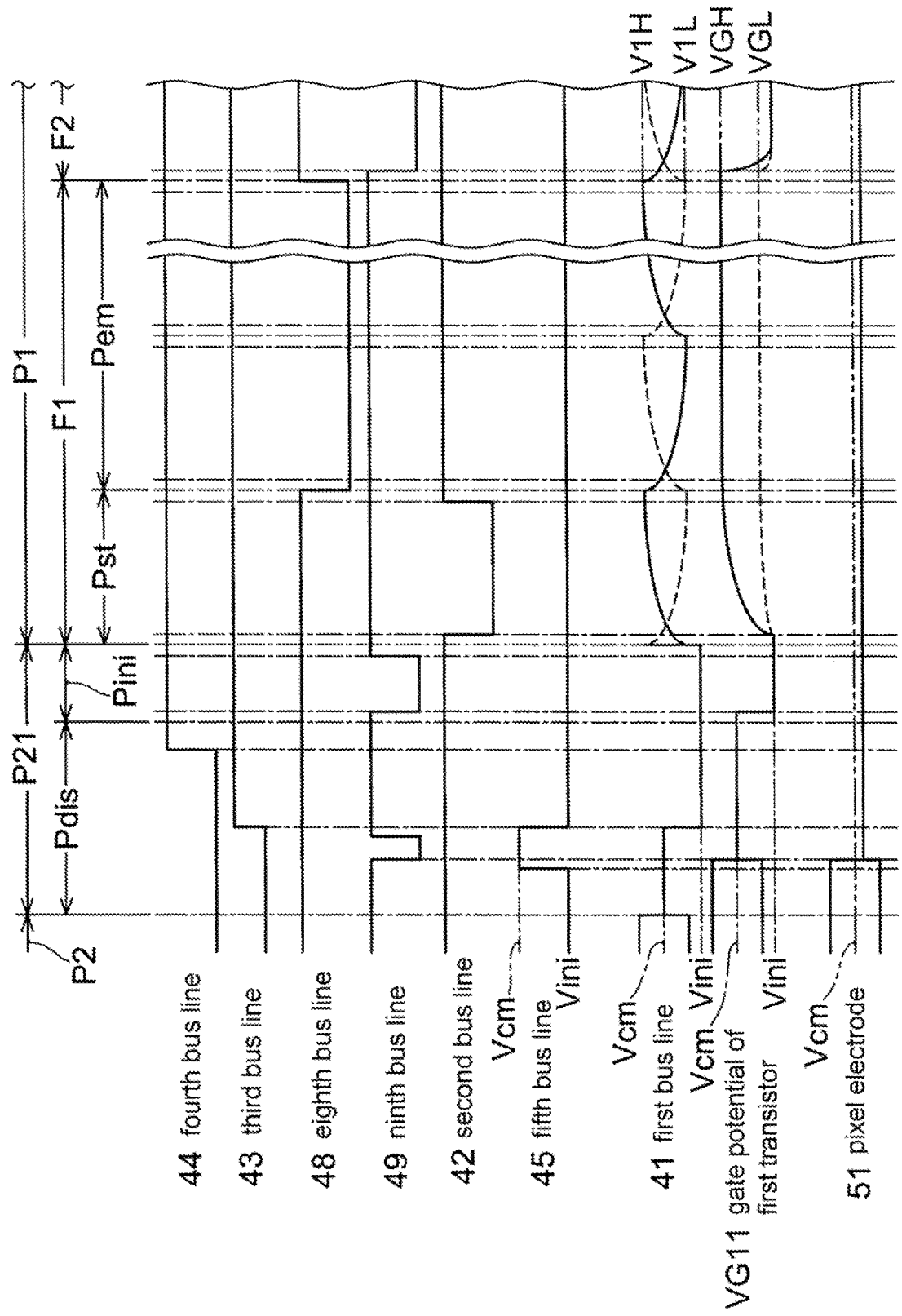
FIG. 13 is a timing chart illustrating an example of the operation during the period of switching from the display by the LC element to the display by the EL element and the period of display by the EL element, in a method for driving the display apparatus according to the Embodiment 2 of the present invention.
Figure 14:
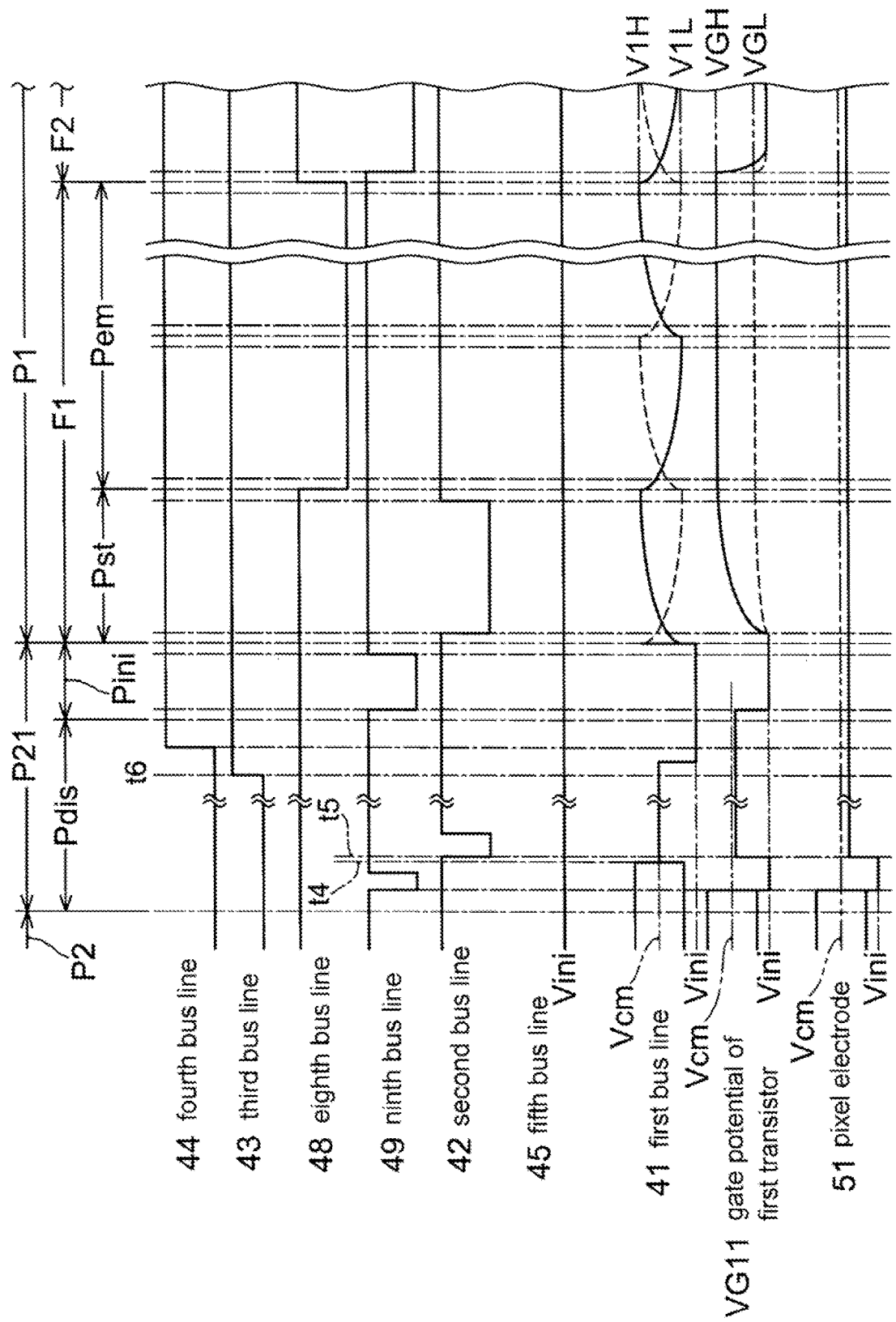
FIG. 14 is a timing chart illustrating another example of the operation during the period of switching from the display by the LC element to the display by the EL element and the period of display by the EL element, in the method for driving the display apparatus according to the Embodiment 2 of the present invention.

A method for driving a display apparatus according to the Embodiment 2 will be described with reference to FIGS. 13 and 14, by taking the driving circuit 10a illustrated in FIG. 12 as an example. FIGS. 13 and 14 illustrate examples of the operation in the switching period P21 from the period of display by the LC element P2 to the display by the EL element, and in the period P1 of display by the EL element, in the method for driving the display apparatus according to the Embodiment 2 of the present invention. The method for driving the display apparatus according to the Embodiment 2 is characterized by applying the voltage based on display data between the gate and the source of the first transistor 21, when performing the display by the EL element 60, and electrically separating the first bus line 41 and the liquid crystal display element 50 by using the second transistor 22, similar to the above-mentioned method for driving the display apparatus according to the Embodiment 1. In addition, the method for driving the display apparatus according to the Embodiment 2 is characterized by electrically connecting the first bus line 41 and the pixel electrode 51 of the LC element 50 by turning on the third transistor 23, when performing the display by the LC element 50, and reducing the potential difference between the pixel electrode 51 and the counter electrode 53 before turning off the second transistor 22 in the switching to the display by the EL element 60.

Further, the method for driving the display apparatus according to the Embodiment 2 includes setting the gate potential of the first transistor 21 to an initial potential Vini after turning off the second transistor 22 (turning the third bus line 43 to the high level), in addition to reducing the potential difference between the pixel electrode 51 and the counter electrode 53 of the LC element 50, in the switching period P21, as illustrated in FIGS. 13 and 14. The initialization of the gate potential is performed before the voltage based on display data is applied between the gate and the source of the first transistor 21.

First, a method for reducing the potential difference between the pixel electrode 51 and the counter electrode 53 of the LC element 50 in the switching period P21 will be described. The reduction of the potential difference is performed in a period for discharging remaining charge Pdis prior to an initialization period Pini described below, as illustrated in FIGS. 13 and 14.

In an example of the potential difference reduction method illustrated in FIG. 13, in the state where the third bus line 43 is at the low level (the second transistor 22 is in the ON state), the potential of the fifth bus line 45 is set to substantially the same potential as the potential of the counter electrode 53 of the LC element 50, that is, the potential Vcm of the COM line. Then, the ninth bus line 49 is set to the low level in all rows of the pixel matrix. By doing so, the eighth transistor 28 is turned on, and the pixel electrode 51 and the fifth bus line 45 are electrically connected via the second transistor 22 and the eighth transistor 28. As a result, the potential of the pixel electrode 51 becomes substantially the same potential as the potential Vcm of the COM line, that is, the potential of the counter electrode 53. In this manner, it is possible to reduce the potential difference between the pixel electrode 51 and the counter electrode 53 before the second transistor 22 is turned from the ON state to the OFF state. Subsequently, the ninth bus line 49 is set to the high level in all rows, and before or after that, the third bus line 43 is set to the high level (the second transistor 22 is turned off). The potential of the fifth bus line 45, although it can be changed to an arbitrary potential other than the potential Vcm after at least either the ninth bus line 49 or the third bus line 43 is set to the high level, is preferably set to the initial potential Vini to be set in the next initialization period Pini. In addition, the gate of the first transistor 21 is set to substantially the same potential as the potential. Vcm as the ninth bus line 49 becomes the low level. In FIG. 13, the potential of the first bus line 41 is set to substantially the same potential as the potential Vcm, while the third bus line 43 is at the low level, and is subsequently set to the initial potential Vini. However, in the example of the potential difference reduction method illustrated in FIG. 13, when the ninth bus line 49 is connected to the second scanning line driver 12a and is controlled independent of another bus line (for example, the second bus line 42), the first bus line 41 can be set to an arbitrary potential in the period for discharging remaining charge Pdis. This is because the first bus line 41 is electrically separated from the gate of the first transistor 21 and the pixel electrode 51, as long as the second bus line 42 is at the high level.

In another example of the method for reducing the potential difference between the pixel electrode 51 and the counter electrode 53 illustrated in FIG. 14, first, the gate potential of the first transistor 21 is set to the initial potential Vini in the state where the third bus line 43 is at the low level (the second transistor 22 is in the ON state). This setting can be performed in the same manner as the initialization of the gate potential of the first transistor 21 in the initialization period Pini described below. More specifically, in the state where the fifth bus line 45 is set to the initial potential Vini, the ninth bus lines 49 is set to the low level in all rows. In this case, as illustrated in FIG. 14, if the second bus line 42 is at the high level, the first bus line 41 can be set to an arbitrary potential. In FIG. 14, the initial potential Vini is a potential lower than the potential Vcm of the COM line (a potential to be next set to the first bus line 41), and the absolute value of the potential difference between the initial potential Vini and the potential. Vcm is not smaller than the absolute value of the threshold voltage VT1 of the first transistor 21.

After the ninth bus line 49 is returned to the high level in all rows, the potential of the first bus line 41 is set to substantially the same potential as the counter electrode 53, that is, the potential Vcm of the COM line (at time t4).

Further, the second bus line 42 in a target row for reducing the potential difference between the pixel electrode 51 and the counter electrode 53 is set to the low level (at time t5), and the third transistor 23 and the fifth transistor 25 are turned on. By setting the fifth transistor 25 to the ON state, the drain and the gate of the first transistor 21 are electrically connected. More specifically, the source and the gate of the first transistor 21 are brought into the state of so-called diode connection, and the first bus line 41 and the pixel electrode 51 are electrically connected via the third, first, fifth, and second transistors 23, 21, 25, and 22. As a result, the potential of the pixel electrode 51 can be a potential close to the potential Vcm set for the first bus line 41 (for example, a potential lower than Vcm by the threshold voltage VT1 of the first transistor 21). In this manner, the potential difference between the pixel electrode 51 and the counter electrode 53 can be reduced. Alternatively, the potential to be set for the first bus line 41 at the time t5 can be previously set to a potential higher than. Vcm by the threshold voltage VT1 of the first transistor 21, so that the potential applied to the pixel electrode 51 via the first transistor 21 in the state of diode connection becomes substantially Vcm. In this manner, the potential difference between the pixel electrode 51 and the counter electrode 53 can be made substantially zero.

Subsequently, the second bus lines 42 in respective rows of the pixel matrix are sequentially set to the low level, and the potential differences between the pixel electrode 51 and the counter electrode 53 of the LC element 50 in respective rows are sequentially reduced. When the reduction of the potential difference between the pixel electrode 51 and the counter electrode 53 completes for the LC element 50 in all rows, the third bus line 43 is set to the high level (at time t6). When the potential of the pixel electrode 51 in each row becomes close to the potential of the counter electrode 53, the second bus line 42 in each row is returned to the high level. The first bus line 41, although it can be changed to an arbitrary potential other than the potential Vcm as mentioned above after the second bus line 42 has been set to the high level in all rows, is desirably set to the initial potential Vini corresponding to a potential to be written in the next initialization period Pini. The gate of the first transistor 21, after it has been set to the initial potential Vini, shifts to a potential close to Vcm as the second bus line 42 becomes the low level. The potential of the fifth bus line 45 can be constantly the initial potential Vini, or can be changed to an arbitrary potential after the gate potential of the first transistor 21 has been set to the initial potential Vini. In the method illustrated in FIG. 14, for example, in the state where the fifth bus line 45 is constantly at the potential Vini, it is possible to reduce the potential difference between the pixel electrode 51 and the counter electrode 53. Even in the method for driving the display apparatus according to the present embodiment, similar to the above-mentioned method according to the Embodiment 1, the pixel electrode 51 may be set to a potential other than the potential Vcm of the COM line for the reduction of the potential difference between the pixel electrode 51 and the counter electrode 53.

Herein below, the initialization period Pini in the switching period P21 in which the gate potential of the first transistor 21 is set to the initial potential Vini will be described. The initial potential Vini is lower than a first potential to be initially set for the first bus line 41 after the switching to the display by the organic EL display element 60, and the absolute value of the potential difference between the initial potential Vini and the first potential is not smaller than the absolute value of the threshold voltage (VT1) of the first transistor 21. In the examples illustrated in FIGS. 13 and 14, the first potential is in a range from potential V1L to potential V1H. The potential V1H is the highest potential among potentials that can be initially set for the first bus line 41, and the potential V1L is the lowest potential. Accordingly, the gate of the first transistor 21 is set to the initial potential Vini that is lower than the first potential being in the range from the potential V1L to the potential V1H by a difference not smaller than the absolute value of VT1, in the switching period P21. Since FIGS. 13 and 14 illustrate similar charts with respect to the initialization period Pini and the period P1 of display by the EL element 60, the following description mainly refers to FIG. 13.

In the initialization period. Pini, the eighth bus line 48 is set to the high level (the sixth transistor 26 and the seventh transistor 27 are turned off), and the potential of the fifth bus line 45 is set to the initial potential Vini. The initial potential Vini can be a constant voltage connected to a stationary power source or a voltage signal connected to a scanning line circuit. Then, the ninth bus line 49 is set to the low level in all rows of the pixel matrix. In other words, the eighth transistor 28 is turned on in all rows. As a result, the gate potential VG11 of the first transistor 21 in every row is set to the potential Vini of the fifth bus line 45. After the setting of the gate potential VG11 of the first transistor 21 to the initial potential Vini completes, the ninth bus line 49 is set to the high level in all rows and the initialization period Pini ends. After the initialization period Pini ends, the potential of the fifth bus line 45 may be changed to an arbitrary potential other than the initial potential Vini. In addition, the potential of the first bus line 41 in the initialization period Pini, although it may be set to an arbitrary potential as long as the second bus line 42 is at the high level, is preferably set to substantially the same potential as the initial potential Vini.

During the period of display by the LC element 50 prior to the switching to the display by the EL element 60, the pixel electrode 51 of the LC element 50 is set to an arbitrary potential based on display data, and the gate of the first transistor 21 is maintained at substantially the same potential as that of the pixel electrode 51. When the transition into the period of display by the EL element 60 is performed in that state, if the first potential to be initially set for the first bus line 41 is lower than the gate potential of the first transistor 21, the source-gate of the first transistor 21 is brought into a reverse bias state. In that case, there is a case that a desired voltage for the display by the EL element 60 cannot be applied between the gate and the source of the first transistor 21. As mentioned above, in the present embodiment, the gate of the first transistor 21 can have substantially the same potential as the counter electrode 53 in the switching period P21. However, even in that case, the source-gate of the first transistor 21 can be brought into the reverse bias state depending on the magnitude of the first potential. Therefore, in the driving method according to the present embodiment, the gate potential VG11 of the first transistor 21 is set to the initial potential Vini before applying the voltage based on display data between the gate and the source of the first transistor 21.

Initialization of the gate potential VG11 of the first transistor 21 can be performed at a time for the first transistors 21 in all rows of the pixel matrix. In that case, at least in the first frame display period F1, it is not always necessary to complete the initialization for each row when applying the voltage to the first transistor 21 in each row. However, the initialization of the gate potential of the first transistor 21 may be performed for each row when applying the voltage based on display data to the first transistors 21 in respective rows. Preferably, in the second frame display period F2 and the following frame display periods, the gate potential VG11 of the first transistor 21 is initialized so that the voltage can be applied to the first transistor 21 without being influenced by the potential having been set to the gate of the first transistor 21 in the immediately preceding frame. In that case, the initialization may be performed at a time for all rows or may be performed for each row.

The ninth bus line 49 may be connected to the scanning line driver 12 together with the second bus line 42 or the like. For example, as the ninth bus line 49 to be connected to each row of the pixel matrix, the second bus line 42 being connected to a neighboring row for each row may be used. By doing so, it may be possible to reduce the total number of necessary bus lines and the number of the scanning line drivers. However, in the case where the second bus line 42 of the neighboring row is used as the ninth bus line 49, when setting the ninth bus lines 49 in all rows to the low level in the above-mentioned period for discharging remaining charge Pdis and the initialization period Pini, the second bus line 42 also becomes the low level. As a result, in addition to the fifth bus line 45, the first bus line 41 is electrically connected to the gate of the first transistor 21 and the pixel electrode 51. In order to realize a stable operation even in such a situation, when setting the gate potential VG11 of the first transistor 21 to the initial potential Vini, the potential of the first bus line 41 is desirably set to substantially the same potential as the initial potential Vini. In addition, when dissipating the remaining charge of the LC element 50 according to the above-described method illustrated in FIG. 13, it is desirable to set the potential of the first bus line 41 to substantially the same potential as the potential of the fifth bus line 45 (e.g., the potential Vcm).

Herein below, an operation during the period P1 of display by the EL element 60 in the driving method according to the present embodiment will be described. With respect to the display by the LC element 50, the driving method according to the present embodiment is different from the driving method according to the Embodiment 1 in only that the voltage is applied to the LC element 50 via the first transistor 21 in addition to the third and second transistors 23 and 22. Therefore, description of the operation to be performed during the period of display by the LC element 50 is omitted.

As illustrated in FIG. 13, after the initialization period Pini ends, by setting the second bus line 42 to the low level in a voltage setting period Pst, the first bus line 41 and the source of the first transistor 21 are electrically connected and the gate of the first transistor 21 and the drain of the first transistor 21 are electrically connected.

Since the gate and the drain of the first transistor 21 are substantially short-circuited, the first transistor 21 is brought into the state of so-called diode connection as mentioned above, and the gate of the first transistor 21 has a potential lower than the potential of the first bus line 41 (e.g., V1H) by the threshold voltage (VT1) of the first transistor 21. Since the first bus line 41 is set to the potential based on the display data FIG. 13, similarly to FIG. 10B described above, the potential is illustrated such that the potential gradually changes due to the influence of the capacitive component), the potential based on the display data is applied to the gate of the first transistor 21. In the voltage setting period Pst, since the eighth bus line 48 is at high level, the sixth and seventh transistors 26 and 27 are in the OFF state, and therefore the EL element 60 does not emit light. On the other hand, electric charge corresponding to the voltage difference between the gate of the first transistor 21 and the fourth bus line 44 is stored in the auxiliary capacitor C1 for the EL element. In FIGS. 13 and 14, on each line indicating the potential of the first bus line 41, a potential variation corresponding to a case where the first bus line 41 is set from the high level (V1H) to the low level (V1L) for each row of the pixel matrix and a potential variation corresponding to a case where it is set from the low level to the high level for each row of the pixel matrix are illustrated to overlap each other. Similarly, on the line indicating the gate potential VG11 of the first transistor 21, a potential variation corresponding to a case where each gate potential is set to the high level (VGH) by writing potential of the first bus line 41 into each gate potential, and a potential variation corresponding to a case where it is set to the low level (VGL) are illustrated to overlap each other.

In the voltage setting period. Pst, since the second bus line 42 is at the low level, the ninth transistor 29 is turned on together with the fifth transistor 25. More specifically, the exemplary method illustrated in FIG. 13 includes discharging the organic EL display element 60 via the ninth transistor 29 when the gate and the drain of the first transistor 21 are electrically connected. As mentioned above, by causing the EL element 60 to discharge before light emission, it is possible to suppress the occurrence of display unevenness or the like.

The potential based on the display data is applied to the gate of the first transistor 21, and after the variation of gate potential as illustrated in FIG. 13 is saturated, the second bus line 42 is set to the high level and the voltage setting period Pst ends. By setting the second bus line 42 to the high level, the third and fifth transistors 23 and 25 are turned off. As a result, the gate and the drain of the first transistor 21 are electrically separated. In addition, the source of the first transistor is separated from the first bus line 41.

In that state, in a light emission period Pem, the eighth bus line 48 is set to the low level and the sixth and seventh transistors 26 and 27 are turned on. When the sixth transistor 26 is turned on, the source of the first transistor 21 is electrically connected to the fourth bus line 44. As a result, the voltage across the auxiliary capacitor C1 for the EL element in the voltage setting period Pst is applied between the gate and the source of the first transistor 21. Based on this gate-source voltage, drain current flows through the first transistor 21 and driving current flows through the EL element 60 that is connected to the first transistor 21 via the seventh transistor 27 being in the ON state. As a result, the EL element 60 emits light with luminance corresponding to the driving current.

The voltage across the auxiliary capacitor C1 for the EL element is determined, as mentioned above, with the gate potential of the first transistor 21 that depends on the threshold voltage (VT1) of the first transistor 21 and the potential of the first bus line 41. Therefore, the threshold voltage is compensated, and the current flowing through the EL element 60 can be precisely controlled.

Referring again to FIG. 2, a structure of the pixel 3 of the display apparatus 1 according to the present embodiment will be described. As illustrated in FIG. 2, the driving circuit 10 including the first and second transistors 21 and 22 is formed on the substrate 2, and the reflection type LC element 50 and the EL element 60 are formed on an insulating layer 31 formed on each transistor. Although not shown in the drawing, various bus lines including the first to fourth bus lines 41 to 44 (refer to FIG. 1) are formed on the substrate 2. In addition, a second substrate 20 is provided so as to face a surface of the substrate 2 on which the LC element 50 and the like are formed. The substrate 2 and the second substrate 20 are spaced with a predetermined clearance and bonded together by a sealant layer (not illustrated) at an outer peripheral portion.

Each pixel 3 includes a first region. R and a second region T neighboring the first region R. The LC element 50 is formed in the first region R, and the EL element 60 is formed in the second region T. The LC element 50 is constituted by the pixel electrode 51 functioning as a reflection electrode, first and second orientation layers 54a and 54b, the liquid crystal layer 52, the counter electrode 53 made of a transparent material such as ITO, a color filter 55, and a polarizing plate 56. The pixel electrode 51 is formed on a third insulating layer 64a described below. The second orientation layer 54b, the counter electrode 53, the color filter 55, and the polarizing plate 56 are provided on the second substrate 20, and are provided in such a way as to entirely cover the pixel 3 together with the liquid crystal layer 52 and first orientation layer 54a.

The EL element 60 includes the anode 61, a second insulating layer 64 defining a light-emitting region, the organic layer 62, the cathode 63, and a covering layer 65 covering the periphery of the cathode 63. In the example illustrated in FIG. 2, the covering layer 65 covers the organic layer 62 and the cathode 63 of the EL element 60 so as to contain them, and an edge of the covering layer 65 is bonded to the insulating layer 31. The covering layer 65 is preferably formed of a material whose water vapor permeability is very low, such as silicon oxide or silicon nitride. Since the organic layer 62 and the cathode 63 are sealed by the covering layer 65 made of such a material, deterioration of the EL element 60 due to contact with moisture is prevented. The third insulating layer 64a, which is made of the same material as the second insulating layer 64 and has substantially the same thickness, is formed on the insulating layer 31 in the first region R. Therefore, it is possible to reduce the difference in thickness of the liquid crystal layer 52 between the first region R and the second region T.

The substrate 2 is, for example, made of a glass substrate or a resin film such as polyimide, and the second substrate 20 is formed of a translucent material, such as glass or a resin film. The insulating layer 31 capable of also functioning as a planarization film is, for example, formed using an organic material such as polyimide. However, from the viewpoint of sealing property with the covering layer 65 described above, the insulating layer 31 may be formed using an inorganic material such as $SiO_y$ or $SiN_x$.

The pixel electrode 51 of the LC element 50 is, for example, a multi-deposited layer of Al (aluminum) and IZO (indium zinc oxide) and is formed only in the first region R. The pixel electrode 51 is connected to the second transistor 22 via a via-contact 64a1 provided in the third insulating layer 64a. An arbitrary liquid crystal material containing a desired liquid crystal material can be used for the liquid crystal layer 52. Preferably, the liquid crystal layer 52 is constituted so that the LC element 50 is to be normally black mode type in cooperation with the polarizing plate 56 and the first and second orientation layers 54a and 54b. By doing so, it may be possible to reduce the amount of electric power consumed by the display apparatus 1.

For example, in a case where the polarizing plate 56 is a circularly polarizing plate and the liquid crystal layer 52 has a quarter-wavelength phase difference, dielectric anisotropy of the liquid crystal material is selected and the first and second orientation layers 54a and 54b corresponding to the dielectric anisotropy are formed, so that liquid crystal molecules are vertically oriented in a state where no voltage is applied. When the liquid crystal layer 52 and the like are constituted as described above, in the state where no voltage is applied, natural light having passed through the polarizing plate 56 travels with no change across the liquid crystal layer 52 being in the vertically oriented state and returns with the phase having been shifted by a quarter wavelength as a result of the reflection at the pixel electrode 51. Accordingly, such light cannot pass through the polarizing plate 56, and the LC element 50 display black picture. On the other hand, when a voltage not smaller than a predetermined value is applied to the liquid crystal layer 52, light having passed through the liquid crystal layer 52 being in a horizontally oriented state is reflected by the pixel electrode 51 as linearly polarized light. Since the light returns to the polarizing plate 56 through an opposite process compared to that at the time of incidence, the light passes through the polarizing plate 56 and exits to the outside.

Although the liquid crystal layer 52 is also formed on the EL element 60, since the pixel electrode 51 is not formed on the EL element 60, light emitted by the EL element 60 passes through the liquid crystal layer 52 being constantly in the vertically oriented state, then passes through the polarizing plate 56, and exits to the outside of the display apparatus 1.

The anode 61 of the EL element 60 is, for example, formed of a multi-deposited layer of ITO/APC/ITO. The second insulating layer 64 is also called as an insulating bank or a partition wall, and is formed of a resin such as polyimide, acrylic resin, or the like. The organic layer 62, although it is illustrated as a single layer in FIG. 2, can be formed as a multi-deposited layer having a multilayer structure including a hole transport layer, a light emission layer, and an electron transport layer. The hole transport layer is, for example, formed of an amine-based material. The light emission layer is, for example, formed of a material in which $Alq_3$, BAlq, or the like serving as a host material is doped with a dopant corresponding to a color of light emitted. The electron transport layer is, for example, formed of $Alq_3$ or the like. The organic layer 62 may further include a hole injection layer, and an electron injection layer formed of an inorganic material. In a case where the color filter 55 is also provided above the EL element 60, the light emission layer may be formed using a material capable of emitting white color light. More specifically, two layers capable of emitting blue and orange color light respectively may be deposited to overlap each other. The cathode 63 is formed of a translucent material, such as a thin Mg—Ag eutectic film. The covering layer 65 made of, for example, an inorganic insulating film such as $Si_3N_4$, $SiO_2$, or the like is formed on a surface of the cathode 63 as a single layer or a multi-deposited layer of two or more layers. Further, the above-described first orientation layer 54a is formed on the covering layer 65. The structure of the display apparatus according to each embodiment is not limited to the example illustrated in FIG. 2.

CONCLUSION

A display apparatus according to a first aspect of the present invention is characterized by comprising: a substrate comprising a plurality of bus lines; and a plurality of pixels provided on the substrate in a matrix pattern, each one of the plurality of pixels including a liquid crystal display element and an organic EL display element, wherein the plurality of bus lines comprises at least, a first bus line provided for each column in the plurality of pixels, a second bus line provided for each row in the plurality of pixels, a third bus line to be set to a predetermined potential when the liquid crystal display element is driven, and a fourth bus line to supply current to the organic EL display element, the liquid crystal display element comprises a pixel electrode and a counter electrode facing each other with an intervening liquid crystal layer containing a liquid crystal composition, the organic EL display element comprises an anode and a cathode each formed so as to be electrically separated from the pixel electrode and the counter electrode, and an organic layer interposed between the anode and the cathode, and each one of the plurality of pixels further comprises a first transistor to change, based on a potential of the first bus line, magnitude of current supplied to the organic EL display element, a second transistor to electrically separate the pixel electrode of the liquid crystal display element and the first bus line based on a potential of the third bus line, and a third transistor to electrically connect the first transistor and the second transistor to the first bus line based on a potential of the second bus line.

According to the configuration of the first aspect of the present invention, in the display apparatus including the liquid crystal display element and the organic EL display element, it is possible to reduce constraints on the driving voltage of the liquid crystal display element and the organic EL display element. In addition, it is possible to reduce the electric power consumption.

A display apparatus according to a second aspect of the present invention, in the above-mentioned first aspect, can further comprise: a current cut-off circuit configured to stop current supply from the fourth bus line to the organic EL display element, wherein the current cut-off circuit can be configured to stop the current supply to the organic EL display element when the first bus line and the pixel electrode are electrically connected by the second transistor.

According to the configuration of the second aspect of the present invention, during the display by the liquid crystal display element, it is possible to prevent current from flowing through the organic EL display element and eliminate unnecessary power consumption. In addition, it is possible to apply a wide range of voltage to the liquid crystal display element.

In a display apparatus according to a third aspect of the present invention, in the above-mentioned first or second aspect, the first transistor can be a field effect transistor, the second transistor and the third transistor can be n-channel field effect transistors, and a source of the third transistor can be connected to a gate of the first transistor and a drain of the second transistor.

According to the configuration of the third aspect of the present invention, it is possible to perform writing of the driving voltage to the liquid crystal display element in a short time.

In a display apparatus according to a fourth aspect of the present invention, in the above-mentioned third aspect, the first transistor can be a p-channel field effect transistor.

According to the configuration of the fourth aspect of the present invention, since the source potential of the first transistor is stabilized, the display quality is stable against deterioration of the organic EL display element and the organic EL display element can be driven by a simple driving method.

In a display apparatus according to a fifth aspect of the present invention, in the above-mentioned third aspect, the first transistor can be an n-channel field effect transistor, and each one of the plurality of pixels can further comprise a fourth transistor connected in parallel with the organic EL display element.

According to the configuration of the fifth aspect of the present invention, it is possible to accurately control the driving current of the organic EL display element.

In a display apparatus according to a sixth aspect of the present invention, in the above-mentioned first or second aspect, the first transistor, the second transistor and the third transistor can be p-channel field effect transistors, and a drain of the third transistor can be connected to a gate of the first transistor and a source of the second transistor.

According to the configuration of the sixth aspect of the present invention, since the source potential of the first transistor is stabilized, the display quality is stable against deterioration of the organic EL display element and the organic EL display element can be driven by a simple driving method.

In a display apparatus according to a seventh aspect of the present invention, in the above-mentioned first aspect, the first transistor, the second transistor, and the third transistor can be p-channel field effect transistors, a source of the first transistor and a drain of the third transistor can be connected to each other, and a source of the third transistor can be connected to the first bus line, a gate of the first transistor and a source of the second transistor can be connected to each other, and a drain of the second transistor can be connected to the pixel electrode of the liquid crystal display element, and each one of the plurality of pixels can further include a fifth transistor provided to substantially short-circuit the gate of the first transistor and a drain of the first transistor based on a potential of the second bus line, a sixth transistor that electrically connects or separates the source of the first transistor and the fourth bus line, and a seventh transistor that electrically connects or separates the drain of the first transistor and the anode of the organic EL display element.

According to the configuration of the seventh aspect of the present invention, it is possible to precisely control the current flowing through the organic EL display element by correcting variations in the threshold voltage of the first transistor in each pixel.

In a display apparatus according to an eighth aspect of the present invention, in the above-mentioned seventh aspect, the plurality of bus lines can further comprise a fifth bus line provided for each row in the plurality of pixels and electrically connected to the gate of the first transistor at the time of initialization of a gate potential of the first transistor, and each one of the plurality of pixels can further comprise an eighth transistor that electrically connects or separates the gate of the first transistor and the fifth bus line.

According to the configuration of the eighth aspect of the present invention, it is possible to easily perform initialization of the gate potential of the first transistor.

In a display apparatus according to a ninth aspect of the present invention, in the above-mentioned seventh or eighth aspect, each one of the plurality of pixels can further comprise a ninth transistor provided to discharge the organic EL display element based on a potential of the second bus line.

According to the configuration of the ninth aspect of the present invention, it is possible to suppress the occurrence of display unevenness or the like of the organic EL display element.

A method for driving a display apparatus according to a tenth aspect of the present invention is characterized by that, in a driving method for a display apparatus comprising a liquid crystal display element and an organic EL display element at each one of a plurality of pixels wherein the liquid crystal display element and an organic EL display element are formed on a surface of a substrate, the method for driving the display apparatus comprises: when performing display by the organic EL display element, applying a voltage based on display data relating to display in each one of the plurality of pixels between a gate and a source of a first transistor that changes current flowing through the organic EL display element, and electrically separating the liquid crystal display element from a first bus line to be set to a potential based on the display data by using a second transistor connected to a pixel electrode of the liquid crystal display element, when performing display by the liquid crystal display element, electrically connecting the first bus line and the pixel electrode by turning on the second transistor and a third transistor provided between the second transistor and the first bus line, and in switching from the display by the liquid crystal display element to the display by the organic EL display element, reducing a potential difference between the pixel electrode and a counter electrode of the liquid crystal display element before bringing the second transistor from an ON state to an OFF state.

According to the configuration of the tenth aspect of the present invention, it is possible to reduce constraints on the driving voltage of the liquid crystal display element and the organic EL display element. In addition, it is possible to prevent the liquid crystal display element from continuing display after transition into the period of display by the organic EL display element.

In a method for driving the display apparatus according to a eleventh aspect of the present invention, in the above-mentioned tenth aspect, when performing display by the liquid crystal display element, current supply to the organic EL display element can be stopped.

According to the configuration of the eleventh aspect of the present invention, during the display by the liquid crystal display element, it is possible to prevent current from flowing through the organic EL display element and eliminate unnecessary power consumption. In addition, it is possible to apply a wide range of voltage to the liquid crystal display element.

In a method for driving the display apparatus according to a twelfth aspect of the present invention, in the above-mentioned tenth or eleventh aspect, in switching from the display by the liquid crystal display element to the display by the organic EL display element, the potential difference between the pixel electrode and the counter electrode can be reduced by setting a potential of the first bus line to substantially the same potential as a potential of the counter electrode.

According to the configuration of the twelfth aspect of the present invention, it is possible to easily prevent the liquid crystal display element from continuing display after transition into the display by the organic EL display element.

In a method for driving the display apparatus according to a thirteenth aspect of the present invention, in the above-mentioned tenth or eleventh aspect, the first transistor, the second transistor, and the third transistor can be p-channel field effect transistors, in switching from the display by the liquid crystal display element to the display by the organic EL display element, after turning off the second transistor, a gate potential of the first transistor can be set to an initial potential that is lower than a first potential to which the first bus line is to be set initially after switching to display by the organic EL display element, wherein an absolute value of a potential difference between the initial potential and the first potential is equal to or more than an absolute value of a threshold voltage of the first transistor, and in the display by the organic EL display element, a drain and the gate of the first transistor can be electrically connected when the potential based on the display data is applied to the gate of the first transistor, and the gate and the drain can be electrically separated after the potential based on the display data is applied to the gate.

According to the configuration of the thirteenth aspect of the present invention, at the time of transition from the period of display by the liquid crystal display element to the period of display by the organic EL display element, even in a state where the gate potential of the first transistor is high, it is possible to apply a desired voltage to the first transistor.

In a method for driving the display apparatus according to a fourteenth aspect of the present invention, in the above-mentioned thirteenth aspect, a potential of a fifth bus line connected to the gate of the first transistor via an eighth transistor can be set to the initial potential, and the gate potential can be set to the initial potential by turning on the eighth transistor.

According to the configuration of the fourteenth aspect of the present invention, it is possible to easily set the gate potential of the first transistor to the initial potential.

In a method for driving the display apparatus according to a fifteenth aspect of the present invention, in the above-mentioned fourteenth aspect, a potential of the first bus line can be set to substantially the same potential as the initial potential when the gate potential is set to the initial potential.

According to the configuration of the fifteenth aspect of the present invention, it is possible to effectively use the bus line in the control for initialization of the gate potential of the first transistor.

In a method for driving the display apparatus according to a sixteenth aspect of the present invention, in any one of the above-mentioned thirteenth to fifteenth aspects, in switching from the display by the liquid crystal display element to the display by the organic EL display element, a potential of a fifth bus line connected to the gate of the first transistor via an eighth transistor can be set to substantially the same potential as a potential of the counter electrode, and the potential difference between the pixel electrode and the counter electrode can be reduced before the second transistor is switched from the ON state to the OFF state by turning on the eighth transistor so as to electrically connect the pixel electrode and the fifth bus line via the second transistor and the eighth transistor.

According to the configuration of the sixteenth aspect of the present invention, it is possible to easily reduce the potential difference between the pixel electrode and the counter electrode of the liquid crystal display element.

In a method for driving the display apparatus according to a seventeenth aspect of the present invention, in any one of the above-mentioned thirteenth to fifteenth aspects, in switching from the display by the liquid crystal display element to the display by the organic EL display element, the gate potential can be set to the initial potential, a potential of the first bus line can be set to substantially the same potential as a potential of the counter electrode, and the potential difference between the pixel electrode and the counter electrode can be reduced before the second transistor is turned off, by turning on the third transistor and electrically connecting the drain and the gate of the first transistor so as to electrically connect the first bus line and the pixel electrode.

According to the configuration of the seventeenth aspect of the present invention, it is possible to reduce the potential difference between the pixel electrode and the counter electrode of the liquid crystal display element without changing the potential of the fifth bus line.

In a method for driving the display apparatus according to an eighteenth aspect of the present invention, in any one of the above-mentioned thirteenth to seventeenth aspects, the organic EL display element can be discharged when the gate and the drain of the first transistor are electrically connected.

According to the configuration of the eighteenth aspect of the present invention, it is possible to suppress the occurrence of display unevenness or the like of the organic EL display element.

DESCRIPTION OF REFERENCE NUMERALS 1 display apparatus
10, 10a driving circuit
11 current cut-off circuit
12 scanning line driver
13 data line driver
2 substrate
21 first transistor
22 second transistor
23 third transistor
24 fourth transistor
25 fifth transistor
26 sixth transistor
27 seventh transistor
28 eighth transistor
29 ninth transistor
30 tenth transistor
3 pixel
41 first bus line
42 second bus line
43 third bus line
44 fourth bus line
45 fifth bus line
46 sixth bus line
47 seventh bus line
48 eighth bus line
49 ninth bus line
50 liquid crystal display element (LC element)
51 pixel electrode
52 liquid crystal layer
53 counter electrode
60 organic EL display element (EL element)
61 anode
62 organic layer
63 cathode
CM COM line
P1 period of display by organic EL display element
P12 period of switching from display by organic EL display element to display by liquid crystal display element
P2 period of display by liquid crystal display element
P21 period of switching from display by liquid crystal display element to display by organic EL display element
Pdis period for discharging remaining charge
Pini initialization period
Vcm potential of COM line
VG11, VG12 gate potential of first transistor
Vini initial potential
VS11 source potential of first transistor
VT1 threshold voltage of first transistor

The invention claimed is:

1. A method for driving a display apparatus comprising a liquid crystal display element and an organic EL display element at each one of a plurality of pixels, the liquid crystal display element and the organic EL display element being formed on a surface of a substrate, the method comprising:

when performing display by the organic EL display element, applying a voltage based on display data relating to display in each one of the plurality of pixels between a gate and a source of a first transistor that changes current flowing through the organic EL display element, and electrically separating the liquid crystal display element from a first bus line to be set to a potential based on the display data by using a second transistor connected to a pixel electrode of the liquid crystal display element, when performing display by the liquid crystal display element, electrically connecting the first bus line and the pixel electrode by turning on the second transistor and a third transistor provided between the second transistor and the first bus line, and in switching from the display by the liquid crystal display element to the display by the organic EL display element, reducing a potential difference between the pixel electrode and a counter electrode of the liquid crystal display element before bringing the second transistor from an ON state to an OFF state, wherein the first transistor, the second transistor, and the third transistor are p-channel field effect transistors, in switching from the display by the liquid crystal display element to the display by the organic EL display element, after turning off the second transistor, a gate potential of the first transistor is set to an initial potential that is lower than a first potential to which the first bus line is to be set initially after switching to display by the organic EL display element, wherein an absolute value of a potential difference between the initial potential and the first potential is equal to or more than an absolute value of a threshold voltage of the first transistor, in the display by the organic EL display element, a drain and the gate of the first transistor are electrically connected when the potential based on the display data is applied to the gate of the first transistor, and the gate and the drain are electrically separated after the potential based on the display data is applied to the gate, in switching from the display by the liquid crystal display element to the display by the organic EL display element, a potential of a fifth bus line connected to the gate of the first transistor via an eighth transistor is set to substantially the same potential as a potential of the counter electrode, and the potential difference between the pixel electrode and the counter electrode is reduced before the second transistor is switched from the ON state to the OFF state by turning on the eighth transistor so as to electrically connect the pixel electrode and the fifth bus line via the second transistor and the eighth transistor.

2. The method for driving the display apparatus according to claim 1, wherein when performing display by the liquid crystal display element, current supply to the organic EL display element is stopped.

3. The method for driving the display apparatus according to claim 1, wherein the organic EL display element is discharged when the gate and the drain of the first transistor are electrically connected.

4. The method for driving the display apparatus according to claim 1, wherein a potential of the fifth bus line is set to the initial potential, and the gate potential is set to the initial potential by turning on the eighth transistor.

5. The method for driving the display apparatus according to claim 4, wherein a potential of the first bus line is set to substantially the same potential as the initial potential when the gate potential is set to the initial potential.

6. A method for driving a display apparatus comprising a liquid crystal display element and an organic EL display element at each one of a plurality of pixels, the liquid crystal display element and the organic EL display element being formed on a surface of a substrate, the method comprising:
  when performing display by the organic EL display element, applying a voltage based on display data relating to display in each one of the plurality of pixels between a gate and a source of a first transistor that changes current flowing through the organic EL display element, and electrically separating the liquid crystal display element from a first bus line to be set to a potential based on the display data by using a second transistor connected to a pixel electrode of the liquid crystal display element,
  when performing display by the liquid crystal display element, electrically connecting the first bus line and the pixel electrode by turning on the second transistor and a third transistor provided between the second transistor and the first bus line, and
  in switching from the display by the liquid crystal display element to the display by the organic EL display element, reducing a potential difference between the pixel electrode and a counter electrode of the liquid crystal display element before bringing the second transistor from an ON state to an OFF state, wherein
  the first transistor, the second transistor, and the third transistor are p-channel field effect transistors,
  in switching from the display by the liquid crystal display element to the display by the organic EL display element, after turning off the second transistor, a gate potential of the first transistor is set to an initial potential that is lower than a first potential to which the first bus line is to be set initially after switching to display by the organic EL display element, wherein an absolute value of a potential difference between the initial potential and the first potential is equal to or more than an absolute value of a threshold voltage of the first transistor,
  in the display by the organic EL display element, a drain and the gate of the first transistor are electrically connected when the potential based on the display data is applied to the gate of the first transistor, and the gate and the drain are electrically separated after the potential based on the display data is applied to the gate
  a potential of a fifth bus line connected to the gate of the first transistor via an eighth transistor is set to the initial potential, and the gate potential is set to the initial potential by turning on the eighth transistor, and
  a potential of the first bus line is set to substantially the same potential as the initial potential when the gate potential is set to the initial potential.

7. The method for driving the display apparatus according to claim 6, wherein
  in switching from the display by the liquid crystal display element to the display by the organic EL display element, the gate potential is set to the initial potential,
  a potential of the first bus line is set to substantially the same potential as a potential of the counter electrode, and
  the potential difference between the pixel electrode and the counter electrode is reduced before the second transistor is turned off, by turning on the third transistor and electrically connecting the drain and the gate of the first transistor so as to electrically connect the first bus line and the pixel electrode.

8. The method for driving the display apparatus according to claim 6, wherein when performing display by the liquid crystal display element, current supply to the organic EL display element is stopped.

9. The method for driving the display apparatus according to claim 6, wherein the organic EL display element is discharged when the gate and the drain of the first transistor are electrically connected.

* * * * *